(12) United States Patent
Lee et al.

(10) Patent No.: US 12,062,633 B2
(45) Date of Patent: Aug. 13, 2024

(54) NON-CONDUCTIVE FILM SHEET AND SEMICONDUCTOR PACKAGE INCLUDING THE SAME

(71) Applicant: Samsung Electronics Co., Ltd., Suwon-si (KR)

(72) Inventors: Joungphil Lee, Seoul (KR); Yeongseok Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 169 days.

(21) Appl. No.: 17/551,387

(22) Filed: Dec. 15, 2021

(65) Prior Publication Data
US 2022/0189902 A1 Jun. 16, 2022

(30) Foreign Application Priority Data
Dec. 16, 2020 (KR) .................. 10-2020-0176597

(51) Int. Cl.
*H01L 23/00* (2006.01)
*C08K 3/013* (2018.01)
(Continued)

(52) U.S. Cl.
CPC .............. *H01L 24/29* (2013.01); *C08K 3/013* (2018.01); *C08K 5/0041* (2013.01); *C08L 63/00* (2013.01); *H01L 22/30* (2013.01); *H01L 23/3675* (2013.01); *H01L 23/49816* (2013.01); *H01L 23/49822* (2013.01); *H01L 23/49833* (2013.01); *H01L 23/49838* (2013.01); *H01L 24/16* (2013.01); *H01L 24/27* (2013.01); *H01L 24/32* (2013.01); *H01L 24/33* (2013.01); *H01L 24/73* (2013.01); *H01L 24/96* (2013.01); *H01L 25/0652* (2013.01); *H01L 2224/16147* (2013.01); *H01L 2224/16227* (2013.01); *H01L 2224/16237* (2013.01); *H01L 2224/27515* (2013.01); *H01L 2224/2919* (2013.01); *H01L 2224/32058* (2013.01); *H01L 2224/32059* (2013.01); *H01L 2224/32145* (2013.01); *H01L 2224/32225* (2013.01); *H01L 2224/3303* (2013.01); *H01L 2224/33055* (2013.01); *H01L 2224/73204* (2013.01); *H01L 2225/06513* (2013.01); *H01L 2225/06517* (2013.01); *H01L 2225/0652* (2013.01); *H01L 2225/06524* (2013.01); *H01L 2225/06541* (2013.01);
(Continued)

(58) Field of Classification Search
None
See application file for complete search history.

(56) References Cited

U.S. PATENT DOCUMENTS 8,017,439 B2  9/2011  Takahashi et al.
8,384,200 B2  2/2013  Seng et al.
(Continued)

FOREIGN PATENT DOCUMENTS

JP   H10247340   *   9/1998

*Primary Examiner* — Long Pham
(74) *Attorney, Agent, or Firm* — Myers Bigel, P.A.

(57) ABSTRACT

Provided is a semiconductor package including: at least one semiconductor device on a first substrate; a non-conductive film (NCF) on the at least one semiconductor device and comprising an irreversible thermochromic pigment; and a molding member on the at least one semiconductor device in a lateral direction, wherein a content of the irreversible thermochromic pigment in the NCF is about 0.1 wt % to about 5 wt % with respect to a weight of the NCF.

19 Claims, 27 Drawing Sheets

(51) Int. Cl.
*C08K 5/00* (2006.01)
*C08L 63/00* (2006.01)
*H01L 21/66* (2006.01)
*H01L 23/367* (2006.01)
*H01L 23/498* (2006.01)
*H01L 25/065* (2023.01)

(52) U.S. Cl.
CPC ............... *H01L 2225/06548* (2013.01); *H01L 2225/06589* (2013.01); *H01L 2924/16251* (2013.01); *H01L 2924/182* (2013.01)

(56) References Cited

U.S. PATENT DOCUMENTS

| | | |
|---|---|---|
| 9,337,125 B2 | 5/2016 | Park et al. |
| 9,922,935 B2 | 3/2018 | Kim |
| 10,153,255 B2 | 12/2018 | Hwang et al. |
| 10,475,937 B1 | 11/2019 | Jones et al. |
| 2007/0114366 A1 | 5/2007 | Wisnudel et al. |
| 2014/0264951 A1 | 9/2014 | Faruqui et al. |
| 2019/0115316 A1 | 4/2019 | Liu |
| 2022/0189902 A1* | 6/2022 | Lee .................. H01L 24/96 |

* cited by examiner

NON-CONDUCTIVE FILM SHEET AND SEMICONDUCTOR PACKAGE INCLUDING THE SAME

CROSS-REFERENCE TO RELATED APPLICATION

This application is based on and claims priority under 35 U.S.C. § 119 to Korean Patent Application No. 10-2020-0176597, filed on Dec. 16, 2020, in the Korean Intellectual Property Office, the disclosure of which is incorporated by reference herein in its entirety.

BACKGROUND

The inventive concepts relate to a non-conductive film (NCF) sheet of a stand-alone type and semiconductor packages including the same, and more particularly, to an NCF sheet of a stand-alone type capable of easily identifying the cause of failure and having good production efficiency and semiconductor packages including the NCF sheet.

An interest in a lamination method and a lamination process of semiconductor devices is increasing due to the compactness and lamination utilized for the integration of the semiconductor devices. Various thermal processes are employed for lamination of the semiconductor devices. In this regard, an approach for tracing the cause of failure during the manufacture of the semiconductor package is needed. In addition, a method of reducing errors in an automated product inspection process of the semiconductor devices is needed.

SUMMARY

The inventive concepts provide a non-conductive film (NCF) sheet capable of identifying a cause of failure and having good production efficiency when applied in the manufacture of a semiconductor package.

The inventive concepts provide a semiconductor package capable of identifying the cause of failure and having good production efficiency.

The inventive concepts provide a manufacturing method of a semiconductor package capable of identifying the cause of failure and having good production efficiency.

According to an aspect of the inventive concepts, there is provided a non-conductive film (NCF) sheet of including: an NCF including an irreversible thermochromic pigment, the NCF including first and second opposing surfaces; a first cover film on the first surface of the NCF; and a second cover film on the second surface of the NCF.

According to another aspect of the inventive concept, there is provided a semiconductor package including: at least one semiconductor device on a first substrate; a non-conductive film (NCF) on the at least one semiconductor device and including an irreversible thermochromic pigment; and a molding member on the at least one semiconductor device in a lateral direction, wherein a content of the irreversible thermochromic pigment in the NCF is about 0.1 wt % to about 5 wt % with respect to a weight of the NCF.

According to still another aspect of the inventive concepts, there is provided a semiconductor package including: a package substrate; an interposer substrate on the package substrate; a first semiconductor device on the interposer substrate and including stacked semiconductor chips; and a second semiconductor device adjacent to the first semiconductor device and on the interposer substrate, wherein the first semiconductor device includes a non-conductive film (NCF) including an irreversible thermochromic pigment.

According to according to another aspect of the inventive concepts, there is provided a manufacturing method of a semiconductor package including: attaching a semiconductor substrate on a carrier substrate; stacking and attaching a plurality of semiconductor chips on the semiconductor substrate by using a non-conductive film (NCF) including an irreversible thermochromic pigment; curing the NCF; providing a molding member on side surfaces of the plurality of semiconductor chips; separating the semiconductor substrate from the carrier substrate; and dicing and singulating the semiconductor substrate and the molding member.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
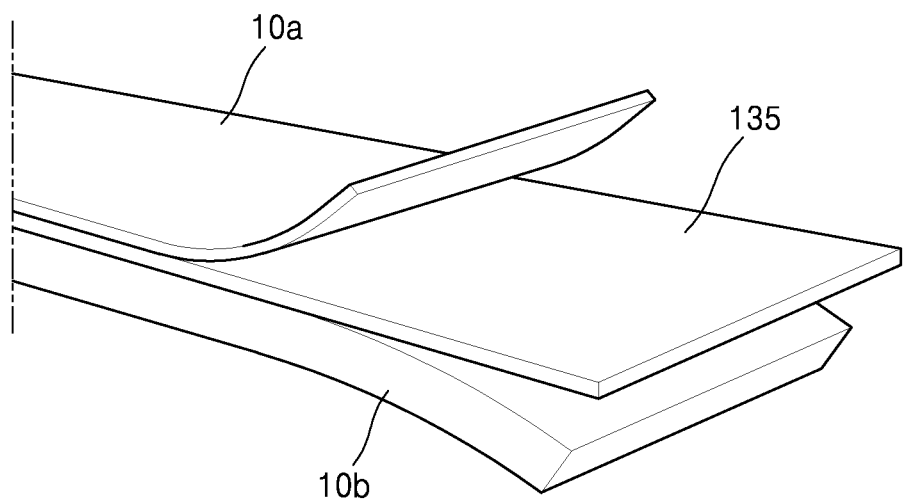
FIG. 1 is a schematic diagram illustrating a non-conductive film (NCF) sheet of a stand-alone type, according to an embodiment of the inventive concepts.

Hereinafter, desirable embodiments of the inventive concept are described in detail in conjunction with the accompanying drawings. Throughout the specification, the same reference numerals are used to indicate the same components.

FIG. 1 is a schematic diagram illustrating a non-conductive film (NCF) sheet of a stand-alone type 10, according to an embodiment of the inventive concepts.

Referring to FIG. 1, the NCF sheet of a stand-alone type 10 may include an NCF 135, a first cover film 10a provided on one side of the NCF 135, and a second cover film 10b provided on an opposing side of the NCF 135. The first cover film 10a and the second cover film 10b may be provided on two main surfaces of the NCF 135.

The first cover film 10a and the second cover film 10b may be used without a particular limit as long as they are generally known polymer films and peelable, and may also include a release film.

Non-limiting examples of usable polymer films may include polyester film such as polyethylene terephthalate (PET), polybutylene terephthalate, and polyethylene naphthalate, a polyethylene film, a polypropylene film, cellophane, a diacetylcellulose film, a triacetyl cellulose film, an acetylcellulose butyrate film, a polyvinyl chloride film, a polyvinyl chloridene film, a polyvinyl alcohol film, an ethylene-acetic acid vinyl copolymer film, a polystyrene film, a polycarbonate film, a polymethylpentene film, a polysulfone film, a polyetheretherketone film, a polyethersulfone film, a polyetherimide film, a polyimide film, a fluorine resin film, a polyamide film, acrylic resin film, a norobonene resin film, a cycloolefin resin film, etc. These polymer films may be transparent or semi-transparent, and colored or non-colored. In some embodiments, the first cover film 10a and/or the second cover film 10b may include PET. In some embodiments, the first cover film 10a and the second cover film 10b may include polyimide.

Thicknesses of the first cover film 10a and the second cover film 10b may be about 25 μm to about 150 μm, about 30 μm to about 100 μm, or about 30 μm to about 80 μm.

When a semiconductor device is packaged, the NCF 135 may combine stacked semiconductor devices to each other, and redistribute and mitigate stress due to a thermal expansion coefficient difference between the package substrate and the semiconductor device while an underfill operation between the package substrate and the semiconductor device is performed.

The NCF 135 may include a matrix polymer and a cross-linking agent dispersed in the matrix polymer.

The matrix polymer may include, for example, a bisphenol A-type epoxy resin, a bisphenol F-type epoxy resin, a naphthalene-type epoxy resin, an aminophenol-type epoxy resin, a water-added bisphenol-type epoxy resin, an alicyclic epoxy resin, an alcohol ether-type epoxy resin, an annular aliphatic-type epoxy resin, a fluorene-type epoxy resin, a siloxane epoxy resin, or the like, but is not limited thereto. These epoxy resins may be used alone or in combination of two or more.

The cross-linking agent may include an anhydride cross-linking agent such as tetrahydrophthalic anhydride, methyl tetrahydrophthalic anhydride, methyl hexahydrophthalic anhydride, hexahydrophthalic anhydride, trialkyl tetrahydrophthalic anhydride, phthalic anhydride, maleic acid anhydride, and pyromelitic acid anhydride; aromatic amine cross-linking agent such as meta-phenylenediamine, diamininophenylmethane, and diaminophenylsulfone; an aliphatic amine cross-linking agent such as diethylenetriamine, and triethylenetetramine; a phenolic cross-linking agent such as phenol aralkyl-type phenol resin, phenol novolac-type phenol resin, xylok-type phenol resin, cresol novolac-type phenol resin, naphthol-type phenol resin, terpene-type phenol resin, polyfunctional phenol resin, dicyclopentadiene phenol resin, naphthalene-type phenol resin, and novolac-type phenolic resin synthesized from bisphenol A and resol; a latent cross-linking agent such as dicyandiamide, or the like, but the inventive concepts are not limited thereto. These cross-linking agents may be used alone or in combination of two or more.

With respect to 100 parts by weight of the NCF 135, the content of the cross-linking agent may be about 10 parts by weight to about 40 parts by weight. When the content of the cross-linking agent is excessively small or excessively large, it may be difficult to control a curing speed.

The NCF 135 may further include an irreversible thermochromic pigment.

The irreversible thermochromic pigment may, as a conjugated system of an electron donating material or an electron accepting material, include a material capable of manifesting colors by changing a structure thereof at a particular temperature.

The irreversible thermochromic pigment may include an organic thermochromic pigment such as leuco dye. The leuco dye may include xanthene leuco dye, thioxanthene leuco dye, acridine leuco dye, phenoxazine leuco dye, phenazine leuco dye, merocyanine leuco dye, thiazine leuco dye, oxazine leuco dye, azine leuco dye, methane leuco dye, azo leuco dye, pyrazoline leuco dye, stilbene leuco dye, coumarin leuco dye, triarylmethane leuco dye, spiropyran leuco dye, phthalide leuco dye, fluoran leuco dye, acryl leuco dye, auramine leuco dye, rhodamine-lactam leuco dye, chromene leuco dye, quinine leuco dye, amino hydrocinnamic acid leuco dye, 2-(p-hydroxyphenyl)-4,5-diphenylimidazole leuco dye, indanone leuco dye, indamine leuco dye, hydrazine leuco dye, indigoid leuco dye, amino-2,3-dihydroanthraquinone leuco dye, tetrahalo-p,p'-biphenol leuco dye, phenylethyl aniline leuco dye, or a combination thereof. However, the embodiments of the inventive concepts are not limited thereto.

In some embodiments, the irreversible thermochromic pigment may include a metal such as copper (Cu), manganese (Mn), chromium (Cr), cobalt (Co), nickel (Ni), iron (Fe), and vanadium (V), and an organic metal compound including an organic ligand coordinated therewith. The ligand may include, for example, amines, ammonium, hydroxy groups, carbon groups, crystal water, etc.

In some embodiments, the irreversible thermochromic pigment may include an inorganic thermochromic pigment as shown in Table 1 below.

TABLE 1

| Irreversible Thermochromic Pigment | Change in Color | Color Changing Temperature (° C.) |
| --- | --- | --- |
| copper iodide (CuI) | gray-tan → orange | 60-62 |
| $2Cu(CNS)_2 \cdot 2pyridine$ | green → yellow | 135 |
|  | yellow → black | 220 |
| $NH_4VO_3$ | white → brown | 150 |
|  | brown → black | 170 |
| $CoCO_2$ | violet → black | 330 |
| $MnNH_4P_2O_7$ | violet → white | 400 |
| $NiC_2O_4$ | light blue → black | 410 |

When an inorganic thermochromic pigment is used as an irreversible thermochromic pigment as shown in Table 1, the irreversible thermochromic pigment may have an average particle diameter of about 0.5 μm to about 50 μm. When the average particle diameter of the irreversible thermochromic pigment is too large or too small, it may be difficult to obtain a uniform distribution.

In some embodiments, the content of the irreversible thermochromic pigment in the NCF 135 may be about 0.1 wt % to about 5 wt % with respect to the weight of the NCF 135. When the amount of the irreversible thermochromic pigment is too large, adhesion characteristics of the NCF 135 may be inhibited and/or light transmittance of the NCF 135 may be inhibited. Alternatively, when the amount of the irreversible thermochromic pigment is too small, a discoloration effect according to temperature change may be insufficient.

Because the NCF 135 includes the irreversible thermochromic pigment, when the NCF 135 is applied to a semiconductor package, the maximum value of the temperature that the NCF 135 during the manufacture of the semiconductor package may be represented by a color of the NCF 135.

By disassembling a manufactured product and examining the color of the NCF 135, whether thermal energy has been properly applied to the NCF 135 may be determined. In addition, when uniformity the color of the NCF 135 is examined, it may be determined whether thermal energy has been uniformly applied to the NCF 135. Accordingly, by examining the NCF 135, whether there has been a problem in a process of applying thermal energy during the manufacture of a product may be quickly and easily verified.

The irreversible thermochromic pigment may be selected such that a color change temperature range is about 60° C. to about 400° C. A magnitude of thermal energy applied to manufacture the semiconductor package may be determined by considering the purpose of applying thermal energy, characteristics of a semiconductor element, heat resistance of each component, or the like. Accordingly, by considering these factors, an irreversible thermochromic pigment having an appropriate color change temperature range may be selected.

The NCF 135 may further include a cross-linking regulator.

The cross-linking regulator may include, for example, 1-methylimidazole, 2-methylimidazole, dimethylbenzylimidazole, 1-decyl-2-methylimidazole, benzyldimethylamine, trimethylamine, triethylamine, diethylaminopropylamine, pyridine, 1,8-diazabicyclo[5.4.0]undec-7-ene, 2-heptadecylimidazol, borontrifluoride monoethylamine, and 1-[3 (2-hydroxyphenyl)prop-2-enyl]imidazol, or the like. However, the embodiments of the inventive concepts are not limited thereto.

With respect to 100 parts by weight of the NCF 135, the content of the cross-linking regulator may be about 1 part by weight to about 5 parts by weight. When the content of the cross-linking regulator is excessively small or excessively large, it may be difficult to control a curing speed.

The NCF 135 may further include an inorganic filler.

The inorganic filler may be a metal particle or a metal oxide particle. The inorganic filler may include, for example, an alumina particle, a silica particle, a titania particle, an aluminum particle, a zinc oxide particle, a silver particle, a silver-coated copper particle, or the like. The inorganic filler may improve the heat dissipation characteristic of a thermal interface material 900.

With respect to 100 parts by weight of the NCF 135, the content of the inorganic filler may be about 0.5 parts by weight to about 10 parts by weight. When the content of the inorganic filler is excessively small, an improvement effect of the heat dissipation characteristic may be minimal. When the content of the inorganic filler is excessively large, the weight may be excessively increased, which may result in an economic disadvantage.

The NCF 135 may be optically transparent or translucent in a visible light range. In this case, the visible light range may indicate a wavelength range of about 350 nm to about 750 nm. In some embodiments, the NCF 135 may have transmittance of about 60% or more with respect to the light of the visible light range. When the NCF 135 has lower transmittance with respect to the light of the visible light range, it may be difficult to precisely align two stacked layers with the NCF 135 therebetween. An upper limit of transmittance is not particularly limited.

Figure 2:
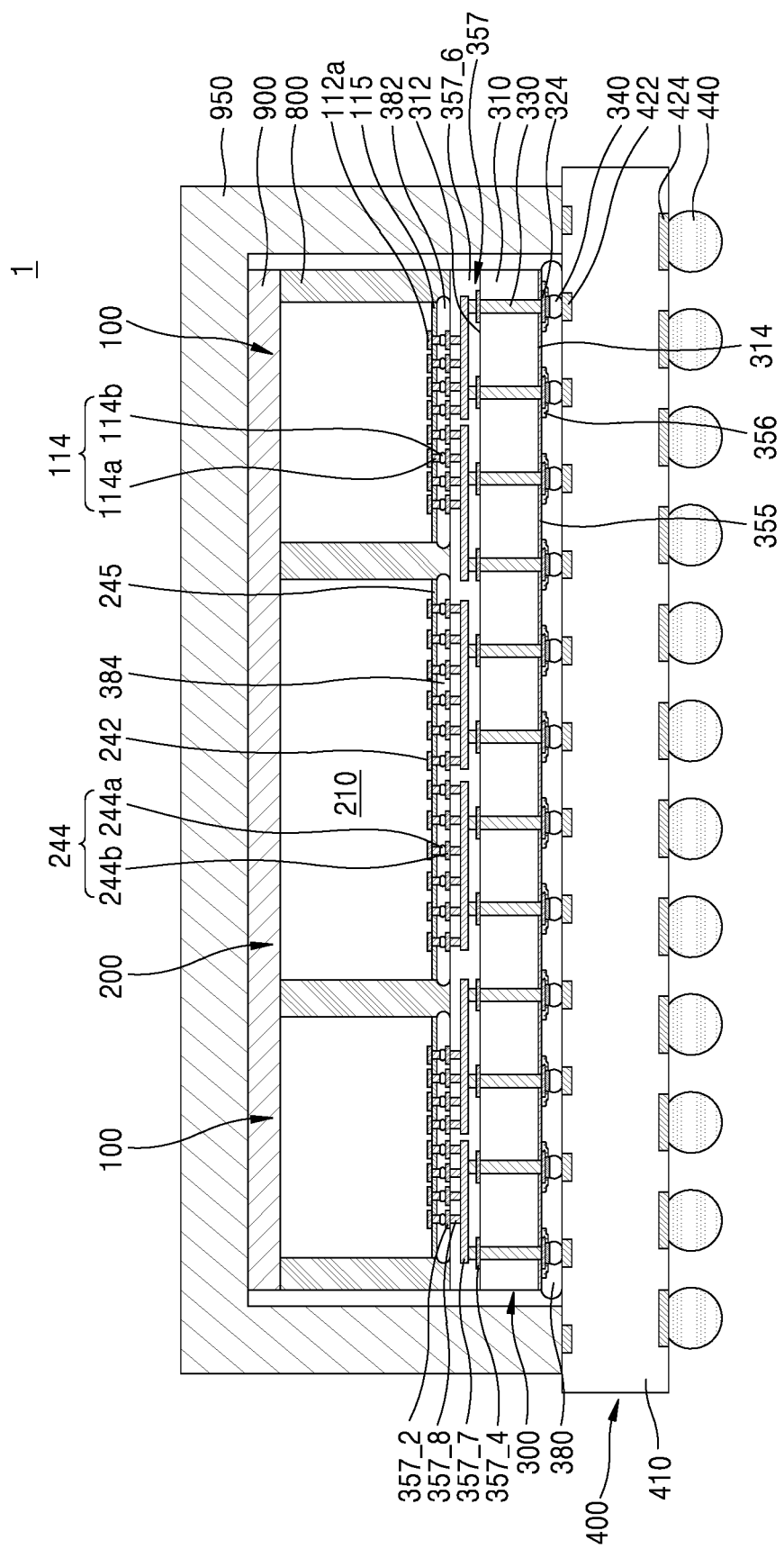
FIG. 2 is a cross-sectional view of a semiconductor package, according to an embodiment of the inventive concepts.
Figure 3A:
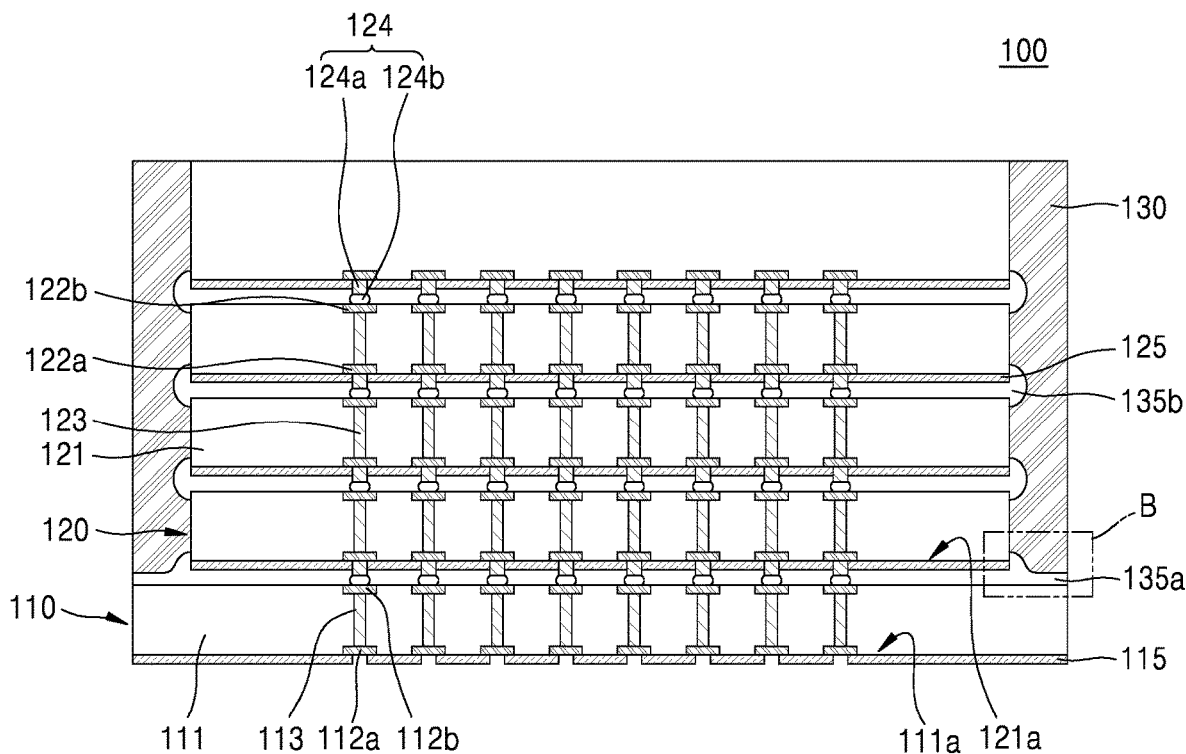
FIG. 3A is a cross-sectional view of a first semiconductor device included in a semiconductor package, according to an embodiment of the inventive concepts.

FIG. 2 is a cross-sectional view of a semiconductor package 1, according to an embodiment of the inventive concepts. FIG. 3A is a cross-sectional view of a first semiconductor device 100 included in the semiconductor package 1, according to an embodiment of the inventive concepts.

Referring to FIGS. 2 and 3A, the semiconductor package 1 may include a second substrate 400 on which a first substrate 300 is mounted, the first semiconductor device 100, and a second semiconductor device 200 which are mounted on the first substrate 300. The first semiconductor device 100 and the second semiconductor device 200 may be mounted adjacent to each other on a redistribution structure 357 of the first substrate 300. In this case, the first semiconductor device 100 and the second semiconductor device 200 may be apart from each other in the lateral direction.

Each of the first semiconductor device 100 and the second semiconductor device 200 may be electrically connected to the first substrate 300 via a plurality of first connection terminals 114 and a plurality of second connection terminals 244. The first semiconductor device 100 may include a plurality of first upper surface connection pads 112a, and the second semiconductor device 200 may include a plurality of second upper surface connection pads 242. The first substrate 300 may include a plurality of first redistribution pads 357_2. The plurality of first connection terminals 114 may be arranged between ones of the plurality of first upper surface connection pads 112a and ones of the plurality of first redistribution pads 357_2. The plurality of second connection terminals 244 may be arranged between ones of the plurality of second upper surface connection pads 242 and ones of the plurality of first redistribution pads 357_2.

Each of the plurality of first connection terminals 114 may include a first conductive filler 114a on the first upper surface connection pad 112a and a first conductive cap 114b on the first conductive filler 114a. Each of the plurality of second connection terminals 244 may include a second conductive pillar 244a on the second upper surface connection pad 242 and a second conductive cap 244b on the second conductive pillar 244a.

The first semiconductor device 100 may include a first semiconductor chip 110 and a plurality of second semiconductor chips 120. In FIG. 3A, the first semiconductor device 100 is illustrated to include four second semiconductor chips 120, but the embodiments of the inventive concepts are not limited thereto. For example, the first semiconductor device 100 may include two or more second semiconductor chips 120. In some embodiments, the number of second semiconductor chips 120 included in the first semiconductor device 100 may be a multiple of four. The plurality of second semiconductor chips 120 may be sequentially stacked on the first semiconductor chip 110 in a vertical direction. Each of the first semiconductor chip 110 and the plurality of second semiconductor chips 120 may be sequentially stacked such that an active side of each of the first semiconductor chip 110 and the plurality of second semiconductor chips 120 faces downwards (that is, toward the first substrate 300).

The first semiconductor chip 110 may include a first semiconductor substrate 111 including a first semiconductor element 111a on an active side thereof, the first upper surface connection pad 112a and a first lower surface connection pad 112b arranged on an active surface and an inactive surface of the first semiconductor substrate 111, respectively, a first through electrode 113 penetrating at least a portion of the first semiconductor substrate 111 and electrically connecting the first upper surface connection pad 112a to the first lower surface connection pad 112b, and a first protective insulating layer 115 exposing at least a portion of the first upper surface connection pad 112a and covering the active surface of the first semiconductor substrate 111.

The first semiconductor substrate 111 may include, for example, a semiconductor material such as silicon (Si). In some embodiments, the first semiconductor substrate 111 may include a semiconductor element such as germanium (Ge), or a compound semiconductor such as silicon carbide (SiC), gallium arsenide (GaAs), indium arsenide (InAs), and indium phosphide (InP). The first semiconductor substrate 111 may include a conductive region, for example, a well doped with impurities. The first semiconductor substrate 111 may have various device isolation structures such as a shallow trench isolation (STI) structure.

In the inventive concepts, an upper surface and a lower surface of a semiconductor substrate such as the first semiconductor substrate 111 may be referred to as an active surface side and an inactive surface side of the semiconductor substrate, respectively. In other words, even when the active surface of the semiconductor substrate is below the inactive surface in a final product, in the inventive concepts, the active surface side of the semiconductor substrate may be referred to as the upper surface of the semiconductor substrate, and the inactive surface side of the semiconductor substrate may be referred to as the lower surface of the semiconductor substrate. In addition, the terms 'an upper surface' and 'a lower surface' may be used for components arranged on the active surface and for components arranged on the inactive surface of the semiconductor substrate, respectively.

The first semiconductor element 111a may include various microelectronic devices, for example, a metal-oxide-semiconductor field effect transistor (MOSFET) such as a complementary metal-insulator-semiconductor (CMOS) transistor, an image sensor such as a system large scale integration (LSI), and a CMOS imaging sensor (CIS), a micro-electro-mechanical system (MEMS), an active device, a passive device, etc. The first semiconductor element 111a may be electrically connected to a conductive region of the first semiconductor substrate 111. In addition, the first semiconductor element 111a may be electrically separated from each of other adjacent first semiconductor elements 111a by an insulating layer.

In some embodiments, the first semiconductor chip 110 may include, for example, a dynamic random-access memory (RAM) (DRAM) chip, a static RAM (SRAM) chip, a flash memory chip, an electrically erasable and programmable RAM (EEPROM) chip, a phase-change RAM (PRAM) chip, a magnetic RAM (MRAM) chip, or a resistive RAM (RRAM) chip. In some embodiments, the first semiconductor chip 110 may include, for example, a central processing unit (CPU) chip, a graphics processing unit (GPU) chip, or an application processor (AP) chip.

In some embodiments, the first semiconductor chip 110 may include a high bandwidth memory (HBM) DRAM semiconductor chip. In some embodiments, the first semiconductor chip 110 may include a buffer chip including a serial-parallel conversion circuit. In some embodiments, the first semiconductor chip 110 may include a buffer chip for controlling the HBM DRAM semiconductor chip. When the first semiconductor chip 110 includes a buffer chip for controlling the HBM DRAM semiconductor chip, the first semiconductor chip 110 may be referred to as a master chip, and the HBM DRAM semiconductor chip may be referred to as a slave chip.

In FIG. 3A, the first upper surface connection pad 112a is illustrated as being buried in the first semiconductor substrate 111, but is not limited thereto. In some embodiments, the first upper surface connection pad 112a may protrude from a surface of the first semiconductor substrate 111.

In the inventive concepts, the first semiconductor substrate 111 may include a base substrate including a semiconductor material, various conductive material layers formed on the base substrate and constituting the first semiconductor element 111a, an insulating material layer, a wiring pattern electrically connected to the first semiconductor element 111a, and a wiring via. In other words, the first semiconductor substrate 111 may mean only that a main material includes the semiconductor material, but may not mean that the first semiconductor substrate 111 includes only the semiconductor material.

The second semiconductor chip 120 may include a second semiconductor substrate 121 including a second semiconductor element 121a formed on an active surface thereof, an inner upper surface connection pad 122a and an inner lower surface connection pad 122b respectively arranged on an active surface and an inactive surface of the second semiconductor substrate 121, a second through electrode 123 penetrating at least a portion of the second semiconductor substrate 121 and electrically connecting the inner upper surface connection pad 122a to the inner lower surface connection pad 122b, and a second protective insulating layer 125 exposing at least a portion of the inner upper surface connection pad 122a and covering an active surface of the second semiconductor substrate 121. The second protective insulating layer 125 may include an inorganic material such as an oxide or a nitride. For example, the second protective insulating layer 125 may include at least one of silicon oxide and silicon nitride. In some embodiments, the second protective insulating layer 125 may include silicon nitride.

The second semiconductor substrate 121, the inner upper surface connection pad 122a, the inner lower surface connection pad 122b, and the second through electrode 123 are substantially and respectively the same as the first semiconductor substrate 111, the first upper surface connection pad 112a, the first lower surface connection pad 112b, and the first through electrode 113, and thus, detailed descriptions thereof are omitted.

The second semiconductor chip 120 may include, for example, a DRAM chip, an SRAM chip, a flash memory chip, an EEPROM chip, a PRAM chip, an MRAM chip, or an RRAM chip. In some embodiment, the second semiconductor chip 120 may include an HBM DRAM semiconductor chip. In some embodiments, the first semiconductor chip 110 may be referred to as a master chip, and the second semiconductor chip 120 may be referred to as a slave chip.

An inner connection terminal 124 may be attached on the inner upper surface connection pad 122a of each of the plurality of second semiconductor chips 120. The inner connection terminal 124 may be electrically connected between the first lower surface connection pad 112b of the first semiconductor chip 110 and the inner upper surface connection pad 122a of the second semiconductor chip 120, and between the inner lower surface connection pad 122b and the inner upper surface connection pad 122a of ones of the second semiconductor chips 120 that are vertically adjacent to each other.

The inner connection terminal 124 may include an inner conductive pillar 124a on the inner upper surface connection pad 122a and an inner conductive cap 124b on the inner conductive pillar 124a.

A width and an area of the first semiconductor chip 110 may be greater than those of each of the plurality of second semiconductor chips 120. The first semiconductor device 100 may further include a molding layer 130 surrounding sides of the plurality of second semiconductor chips 120 on the first semiconductor chip 110 and sides of a second non-conductive film 135b to be described later. The molding layer 130 may include, for example, an epoxy mold compound (EMC).

A first NCF 135a may be arranged between the first semiconductor chip 110 and a lowermost one of the second semiconductor chips 120. The first NCF 135a may surround the inner connection terminal 124, and fill a space between the first semiconductor chip 110 and the lowermost one of the second semiconductor chips 120. It will be understood that "an element A surrounds an element B" (or similar language) as used herein means that the element A is at least partially around the element B but does not necessarily mean that the element A completely encloses the element B. It will be understood that "an element A fills an element B" (or similar language) as used herein means that the element A is in the element B but does not necessarily mean that the element A fills the element B entirely.

The first NCF 135a may extend from a side surface of the lowermost one of the second semiconductor chips 120 to a side surface of the first semiconductor chip 110. Furthermore, the first NCF 135a may be exposed from a side surface of the molding layer 130.

Figure 3B:
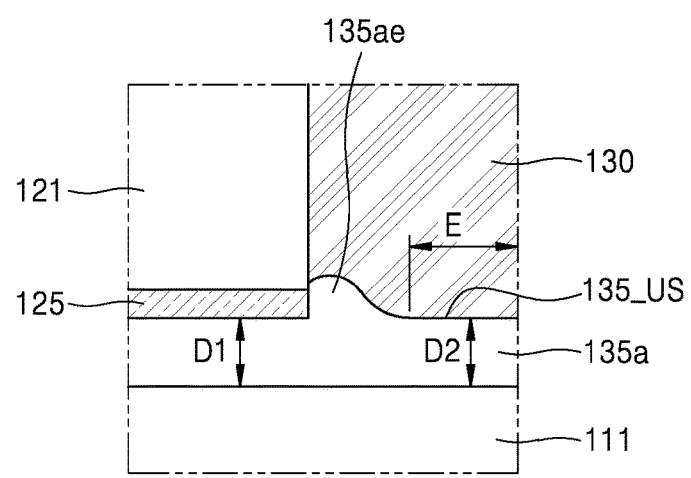
FIG. 3B is a partially enlarged view of region B in FIG. 3A.

FIG. 3B is a partially enlarged view of region B in FIG. 3A.

Referring to FIG. 3B, the first NCF 135a may include a ridge portion 135ae adjacent to the side surface of the second semiconductor chip 120 located at the lowermost end and protruding in an upward direction. In addition, the first NCF 135a may include a flat portion E adjacent to the ridge portion 135ae. An upper surface 135_US of the first NCF 135a may have a flat surface in the flat portion E, and may extend substantially and horizontally in parallel with an upper surface of the first semiconductor substrate 111.

The first NCF 135a may have a first thickness D1 between the lowermost one of the second semiconductor chips 120 and the first semiconductor substrate 111. In addition, a flat portion E of the first NCF 135a may have a second thickness D2. The flat portion E of the first NCF 135a may overlap (e.g., vertically) the first semiconductor substrate 111 but not the lowermost one of the second semiconductor chips 120. The second thickness D2 may be greater than the first thickness D1. In some embodiments, the first thickness D1 may be the same as a distance between the lowermost one of the second semiconductor chips 120 and the first semiconductor substrate 111.

Referring to FIG. 3A again, the second NCF 135b may be arranged between two adjacent second semiconductor chips 120. The second NCF 135b may fill a space between the two adjacent second semiconductor chips 120 surrounding the inner connection terminal 124.

The second NCF 135b may extend and protrude from a space between the two adjacent second semiconductor chips 120 in the lateral direction. In this case, the second NCF 135b may not be exposed to the outside of the molding layer 130.

In some embodiments, the second NCF 135b may extend up to a side surface of the molding layer 130. In some embodiments, the second NCF 135b may be exposed from the side surface of the molding layer 130 to the outside.

In some embodiments, among the plurality of second semiconductor chips 120, the second semiconductor chip 120 arranged farthest from the first semiconductor chip 110 (e.g., an uppermost one of the second semiconductor chips 120) may not include the inner lower surface connection pad 122b and the second through electrode 123. In some embodiments, among the plurality of second semiconductor chips 120, a thickness of the second semiconductor chip 120 arranged farthest from the first semiconductor chip 110 and located at the uppermost end may be greater that a thickness of the other second semiconductor chips 120.

Referring to FIG. 2, the second semiconductor device 200 may include a third semiconductor substrate 210, the second upper surface connection pad 242, a third protective insulating layer 245, and the second connection terminal 244. The second connection terminal 244 may include the second conductive pillar 244a on the second upper surface connection pad 242 and a second conductive cap 244b on the second conductive pillar 244a. The third semiconductor substrate 210, the second upper surface connection pad 242, the third protective insulating layer 245, and the second connection terminal 244 may be substantially similar components to the first semiconductor substrate 111, the first upper surface connection pad 112a, the first protective insulating layer 115, and the first connection terminal 114, or may be substantially similar components to the second semiconductor substrate 121, the inner upper surface connection pad 122a, the second protective insulating layer 125, and the inner connection terminal 124, respectively, and thus, detailed descriptions thereof are omitted.

The second semiconductor device 200 may include, for example, a central processing unit (CPU) chip, a graphics processing unit (GPU) chip, or an application processor (AP) chip.

The first substrate 300 may include a base layer 310, the redistribution structure 357 arranged on a first surface 312 of the base layer 310, and a plurality of pad wiring layers 324 arranged on a second surface 314 of the base layer 310. The redistribution structure 357 may include a redistribution insulating layer 357_6, a plurality of first redistribution pads 357_2 arranged on both surfaces of the redistribution insulating layer 357_6, and a plurality of second redistribution pads 357_4. Accordingly, the plurality of first redistribution pads 357_2 may be arranged on the upper surface of the first substrate 300, and the plurality of pad wiring layers 324 may be arranged on the lower surface of the first substrate 300.

The base layer 310 may include a semiconductor material, glass, ceramic, and/or plastic. For example, the base layer 310 may include silicon. In some embodiments, the base layer 310 may be formed from a semiconductor substrate of silicon. A plurality of first substrate through electrodes 330 connecting between the first surface 312 and the second surface 314 may be arranged inside the base layer 310. Each of the plurality of first substrate through electrodes 330 may include a conductive plug penetrating the base layer 310 and a conductive barrier layer surrounding the conductive plug. The conductive plug may have a circular shape, and the conductive barrier layer may have a cylindrical shape surrounding a side wall of the conductive plug. A plurality of via insulating layers may be arranged between the base layer 310 and the plurality of first substrate through electrodes 330, and surround side walls of the plurality of first substrate through electrodes 330.

The redistribution structure 357 may include a redistribution insulating layer 357_6, a plurality of first redistribution pads 357_2 arranged on both surfaces of the redistribution insulating layer 357_6, and a plurality of second redistribution pads 357_4. The plurality of second redistribution pads 357_4 may be arranged on the first surface 312 of the base layer 310, and may be electrically connected to the plurality of first substrate through electrodes 330. The plurality of first substrate through electrodes 330 may be electrically connected between the plurality of second redistribution pads 357_4 and the plurality of pad wiring layers 324.

The redistribution structure 357 may further include a plurality of redistribution lines 357_7 electrically connecting the plurality of first redistribution pads 357_2 to the plurality of second redistribution pads 357_4, and a plurality of redistribution vias 357_8. In FIG. 2, the plurality of redistribution lines 357_7 are illustrated as being inside the redistribution insulating layer 357_6, but the inventive concepts are not limited thereto.

For example, each of the plurality of first redistribution pads 357_2, the plurality of second redistribution pads 357_4, the plurality of redistribution lines 357_7, and the plurality of redistribution vias 357_8 may include copper, nickel, stainless steel, and/or a copper alloy such as beryllium copper. For example, the redistribution insulating layer 357_6 may include at least one of an oxide, a nitride, and a photo imageable dielectric (PID). In some embodiments, the redistribution insulating layer 357_6 may include silicon oxide, silicon nitride, epoxy, and/or polyimide.

A first substrate protective layer 355, the plurality of pad wiring layers 324 arranged on the first substrate protective layer 355 and connected to the plurality of first substrate through electrodes 330 penetrating the first substrate protective layer 355, a plurality of first substrate connection terminals 340 arranged on the plurality of pad wiring layers 324, and a plurality of wiring protective layers 356 surrounding the plurality of first substrate connection terminals 340 and on the plurality of pad wiring layers 324 may be arranged on the second surface 314 of the base layer 310.

The first substrate 300 may be an interposer.

A first underfill layer 382 may be arranged between the first semiconductor device 100 and the first substrate 300, and a second underfill layer 384 may be arranged between the second semiconductor device 200 and the first substrate 300. The first underfill layer 382 and the second underfill layer 384 may surround the first connection terminal 114 and the second connection terminal 244, respectively. In some embodiments, the first underfill layer 382 may protrude from the side surface of the first semiconductor device 100 in the lateral direction. In some embodiments, the second underfill layer 384 may protrude from a side surface of the second semiconductor device 200 in the lateral direction.

In some embodiments, at least one of the first underfill layer 382 and the second underfill layer 384 may include the irreversible thermochromic pigment. This issue will be described in more detail herein.

The second substrate 400 may include a base board layer 410, and a board upper surface pad 422 and a board lower surface pad 424 respectively arranged on an upper surface and a lower surface of the base board layer 410. In some embodiments, the second substrate 400 may include a printed circuit board. For example, the second substrate 400 may include a multi-layer printed circuit board. The base board layer 410 may include at least one material of phenol resin, epoxy resin, and polyimide.

A solder resist layer (not illustrated) for exposing the board upper surface pad 422 and the board lower surface pad 424 on the upper surface and the lower surface of the base board layer 410, respectively, may be present in some embodiments. The first substrate connection terminal 340 may be connected to the board upper surface pad 422, and a package connection terminal 440 may be connected to the board lower surface pad 424. The first substrate connection terminal 340 may electrically connect between the plurality of pad wiring layers 324 and the board upper surface pad 422. The package connection terminal 440 connected to the board lower surface pad 424 may connect the semiconductor package 1 to an external device.

The package connection terminal 440 may have greater dimensions (for example, a diameter) than the plurality of first connection terminals 114, the plurality of second connection terminals 244, and the first substrate connection terminal 340. In addition, the first substrate connection terminal 340 may have greater dimensions (for example, a diameter) than the plurality of first connection terminals 114 and the plurality of second connection terminals 244.

A board underfill layer 380 may be arranged between the first substrate 300 and the second substrate 400. The board underfill layer 380 may surround the plurality of first substrate connection terminals 340.

In some embodiments, one or more of the first underfill layer 382, the second underfill layer 384, and the board underfill layer 380 may include the irreversible thermochromic pigment. In some embodiments, one or more of the first underfill layer 382, the second underfill layer 384, and the board underfill layer 380 may include the NCF 135 described with reference to FIG. 1.

The NCF 135 described with reference to FIG. 1 may have a convex side surface toward the outside when applied to the semiconductor package 1 as one or more of the first underfill layer 382, the second underfill layer 384, and the board underfill layer 380.

FIG. 2 illustrates that the NCF 135 is applied to each of the first underfill layer 382, the second underfill layer 384, and the board underfill layer 380. Each of the first underfill layer 382, the second underfill layer 384, and the board underfill layer 380 may have a convex side surface toward the outside. In some embodiments, the first underfill layer 382, the second underfill layer 384, and the board underfill layer 380, to which the NCF 135 is applied, may be convex toward the outside, and as similar to descriptions given with reference to FIG. 3, may include a protrusion protruding in an upward direction.

In some embodiments, the first underfill layer 382, the second underfill layer 384, and the board underfill layer 380, to which the NCF 135 is applied, may be optically opaque. In some embodiments, light transmittance of the first underfill layer 382, the second underfill layer 384, and the board underfill layer 380, to which the NCF 135 is applied, may be less than about 10% with respect to light having a wavelength range of about 380 nm to about 750 nm. When the light transmittance of the first underfill layer 382, the second underfill layer 384, and the board underfill layer 380 is excessively high and they are exposed to the outside of a molding layer to be described later, a determination error of a failure may occur, even though a failure did not occur.

The semiconductor package 1 may further include a package molding layer 800 surrounding side surfaces of the first semiconductor device 100 and the second semiconductor device 200 on the first substrate 300. The package molding layer 800 may include, for example, an epoxy mold compound (EMC).

In some embodiments, the package molding layer 800 may be on and/or cover an upper surface of the first substrate 300 and the side surface of each of the first semiconductor device 100 and the second semiconductor device 200, but not cover upper surfaces of the first semiconductor device 100 and the second semiconductor device 200. In some embodiments, the semiconductor package 1 may further include a heat dissipating member 950 covering the upper surfaces of the first semiconductor device 100 and the second semiconductor device 200. The heat dissipating member 950 may include a heat dissipating plate such as a heat slug or a heat sink. In some embodiments, the heat dissipating member 950 may surround upper surfaces and side surfaces of the first semiconductor device 100, the second semiconductor device 200, and the first substrate 300, on the upper surface of the second substrate 400. In some embodiments, the heat dissipating member 950 may include a flat plate or a solid structure of a metal material.

In some embodiments, the heat dissipating member 950 may perform an electronic wave blocking function and a heat dissipating function, and may be connected to the board upper surface pad 422 provided with a ground of the plurality of board upper surface pads 422 of the second substrate 400.

The semiconductor package 1 may include a thermal interface material (TIM) 900 arranged between the heat dissipating member 950, and the first semiconductor device 100 and the second semiconductor device 200. The TIM 900 may include paste or a film.

Figure 4A:
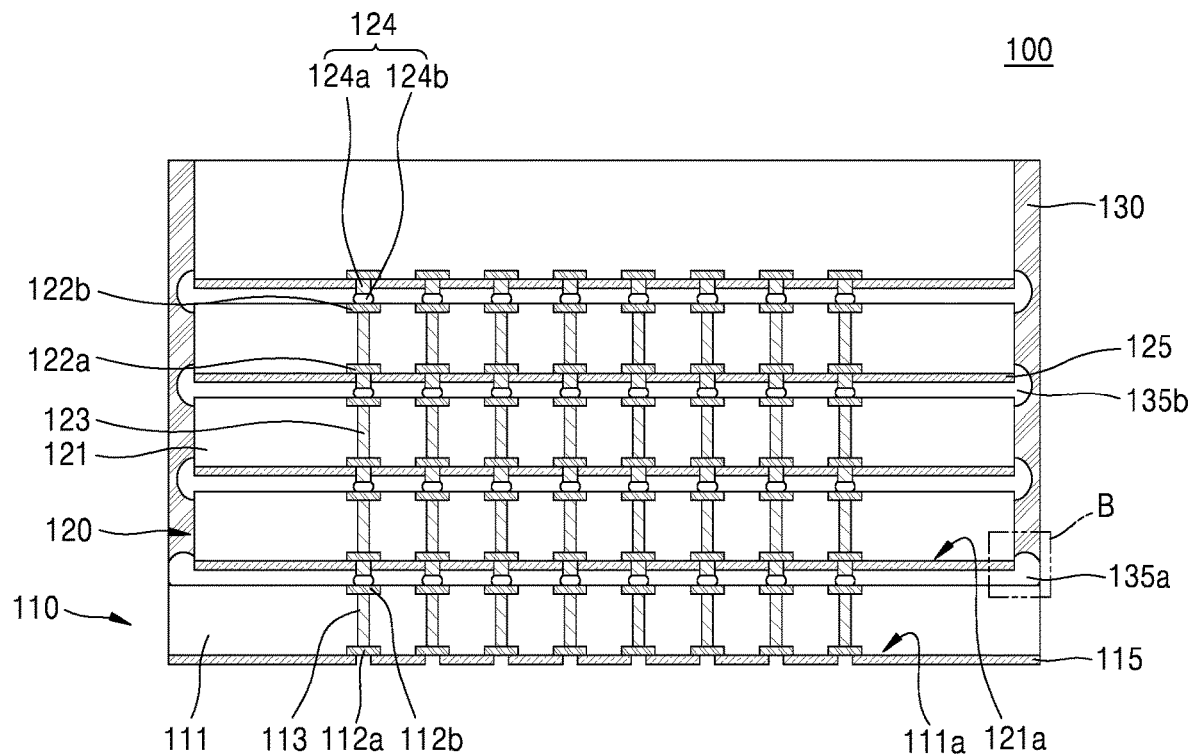
FIG. 4A is a cross-sectional view of a first semiconductor device included in a semiconductor package, according to another embodiment of the inventive concepts.
Figure 4B:
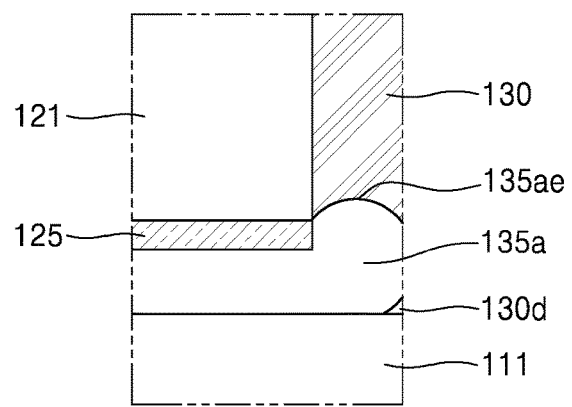
FIG. 4B is a partially enlarged view of region B in FIG. 4A.

FIG. 4A is a cross-sectional view of a first semiconductor device 100 included in the semiconductor package 1, according to another embodiment of the inventive concepts. FIG. 4B is a partially enlarged view of region B in FIG. 4A. The first semiconductor device 100 of the embodiments illustrated in FIG. 4A and FIG. 4B are different, with respect to the first semiconductor device 100 of the embodiments illustrated in FIG. 3A and FIG. 3B, in that the flat portion E is not included. Thus, descriptions below will be given based on this difference.

Referring to FIGS. 4A and 4B, the first NCF 135*a* may be exposed from the side surface of the molding layer 130. In addition, the first NCF 135*a* may include a ridge portion 135*ae* adjacent to the side surface of the lowermost one of the second semiconductor chips 120 and protruding in the upward direction. The first NCF 135*a* may be manufactured by using the NCF 135 described with reference to FIG. 1, and may include a thermochromic pigment.

In some embodiments, when viewed from the side surface of the molding layer 130, a molding layer remainder 130*d* including the same material as the molding layer 130 may be arranged between the first semiconductor substrate 111 and the first NCF 135*a*. The molding layer remainder 130*d* may be connected to and integrated with the molding layer 130.

The second NCF 135*b* may not be exposed to the outside of the molding layer 130. However, when distances between the side surfaces of the plurality of second semiconductor chips 120 and the side surface of the molding layer 130 are singulated and extremely short, the second NCF 135*b* may be exposed to the outside of the molding layer 130.

FIGS. 5A through 5G are schematic side cross-sectional views illustrating a manufacturing method of a semiconductor package, according to example embodiments of the inventive concepts. Descriptions of elements previously described will be omitted for brevity.

Figure 5A:
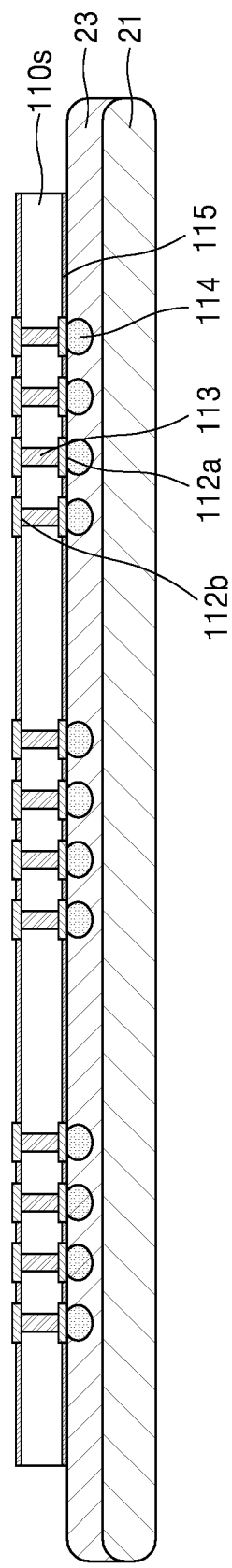
FIGS. 5A through 5G are schematic side cross-sectional views illustrating a manufacturing method of a semiconductor package, according to example embodiments of the inventive concepts.

Referring to FIG. 5A, a semiconductor substrate 110*s* may be attached on a carrier substrate 21.

The carrier substrate 21 may include, for example, silicon (for example, a blank device wafer), soda lime glass, borosilicate glass, silicon carbide, silicon germanium, silicon nitride, gallium arsenic, sapphire, various metals, and ceramics. However, the inventive concepts are not limited thereto.

The semiconductor substrate 110*s* may include a semiconductor such as Si and Ge, or a compound semiconductor such as SiGe, SiC, GaAs, InAs, and InP, and an active surface on which a semiconductor element is formed may be arranged to face the carrier substrate 21.

The semiconductor substrate 110*s* may be attached to the carrier substrate 21 by using a binder 23. The binder 23 may include a general adhesive including a polysiloxane compound, and may combine the carrier substrate 21 with the semiconductor substrate 110*s* at a sufficient strength.

Figure 5B:
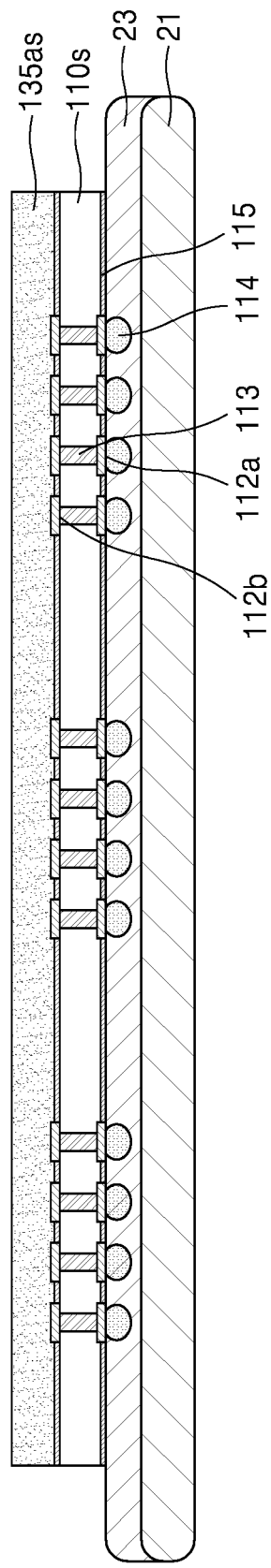

Referring to FIG. 5B, a first NCF 135*as* having substantially the same size (for example, a plan area) as the semiconductor substrate 110*s* may be provided on the semiconductor substrate 110*s*. The first NCF 135*as* may be manufactured by using the NCF 135 described with reference to FIG. 1, and may include the thermochromic pigment. Because the first NCF 135*as* has adhesion to a degree, the first NCF 135*as* may be attached on the semiconductor substrate 110*s*. In addition, the first NCF 135*as* may not yet be sufficiently and/or completely cured, and thus may be somewhat in a changeable state by an external force.

For attachment of the first NCF 135*as*, the first NCF 135*as* may be heated at a temperature of about 170° C. to about 300° C. for about 1 second to about 20 seconds. A heating temperature and a heating time may be determined by considering an amount of thermal energy transferred to the first NCF 135*as*. When an excessive thermal energy is applied to the first NCF 135*as*, due to over-cure, it may be difficult to proceed with subsequent processes.

Figure 5C:
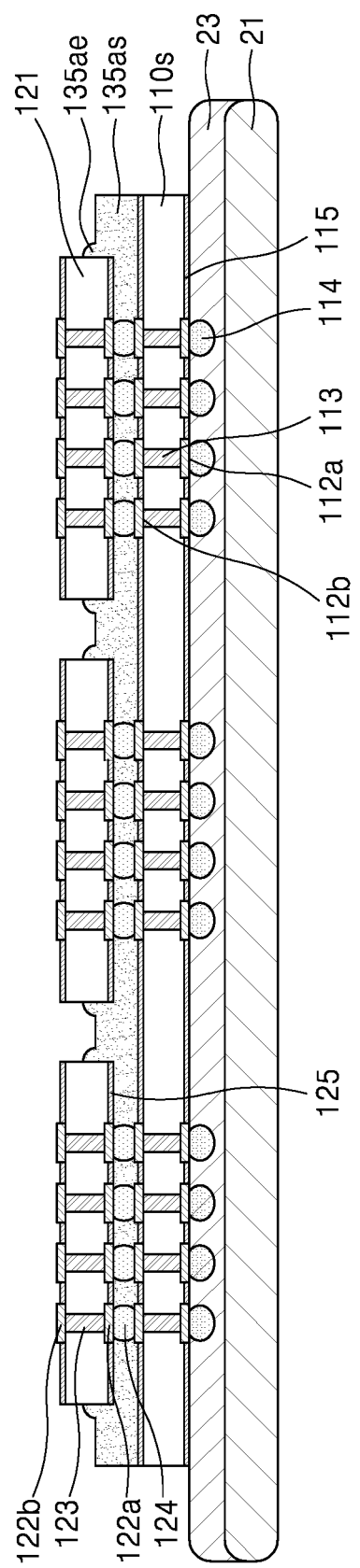

Referring to FIG. 5C, the plurality of second semiconductor substrates 121 may be stacked on the semiconductor substrate 110*s*. The inner connection terminal 124 provided to the second semiconductor substrates 121 may penetrate the first NCF 135*as* and contact the first lower surface connection pad 112*b*. In some embodiments, due to a volume of the inner connection terminal 124, a portion of the first NCF 135*as* may be protruded upward adjacent to the second semiconductor substrates 121 and, in some embodiments, may form the ridge portion 135*ae*.

Figure 5D:
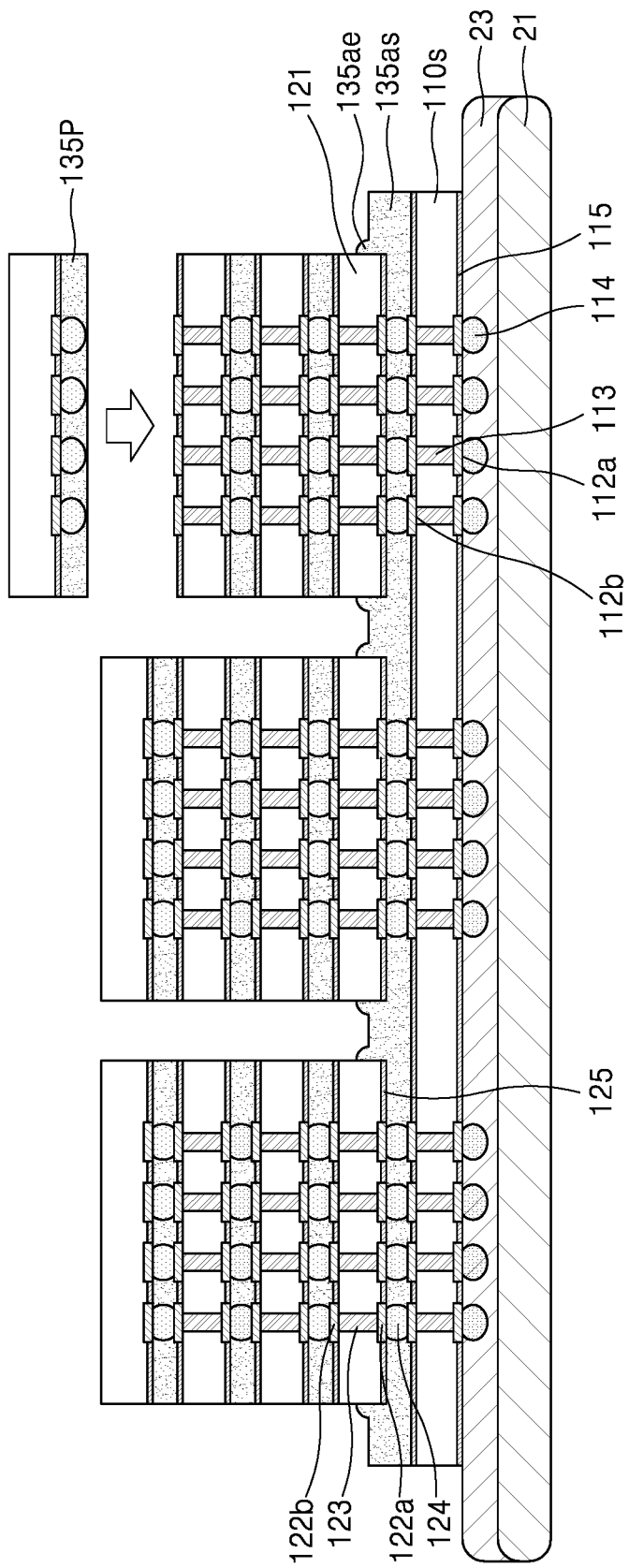

Referring to FIG. 5D, a plurality of the second semiconductor substrates 121 to which a second NCF 135*p* is added may be additionally stacked. In some embodiments, a plan area of the second NCF 135*p* may be substantially the same as that of the second semiconductor substrate 121.

In FIG. 5D, it is illustrated that four second semiconductor substrates 121 are stacked, but it should be readily understood by one of ordinary skill in the art that a number less than or more than four of the second semiconductor substrates 121 may be stacked.

For attachment of the second NCF 135*p*, the second NCF 135*p* may be heated at a temperature of about 170° C. to about 300° C. for about 1 second to about 20 seconds.

Figure 5E:
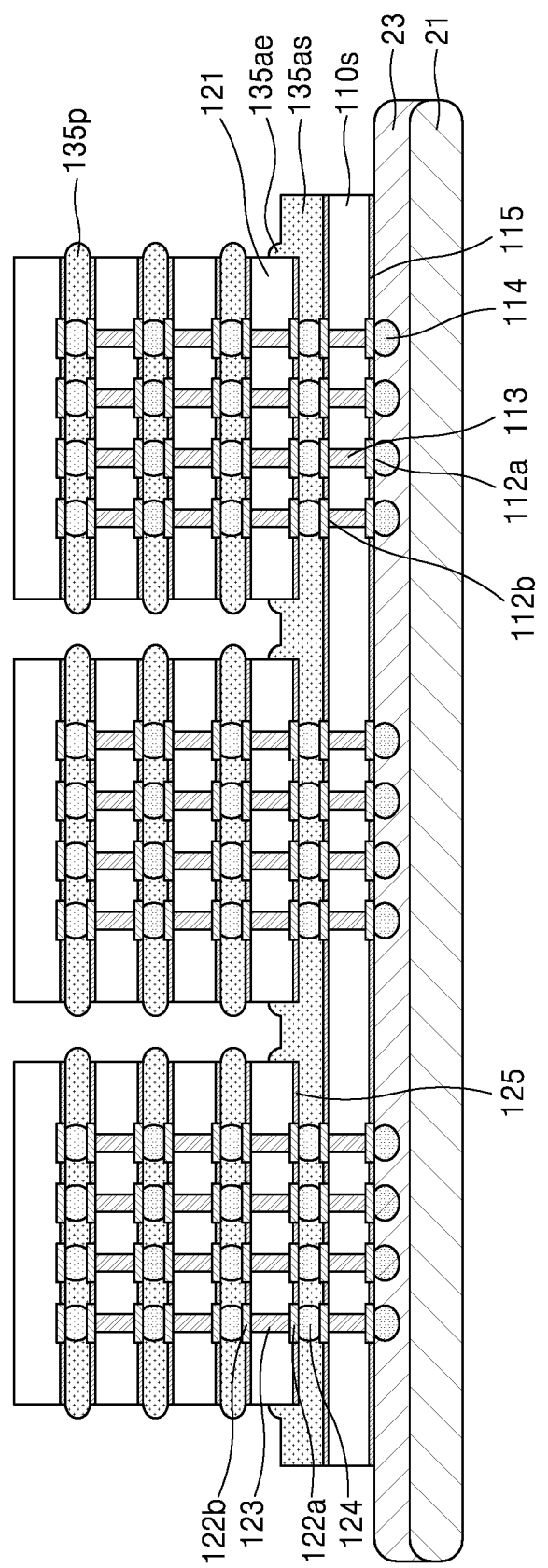

Referring to FIG. 5E, the first NCF 135*as* and the second NCF 135*p* may be cured. The curing may be performed at a temperature of about 130° C. to about 210° C. for about 30 minutes to about 3 hours. The curing temperature may be somewhat lower than a temperature for attaching the first NCF 135*as* or the second NCF 135*p*. A duration time of the curing may be longer than a heating time for attaching the first NCF 135*as* or the second NCF 135*p*.

While the curing is performed by a cross-linking agent in the first and second NCFs 135*as* and 135*p*, the second NCFs 135*p* may be somewhat reflowed due to heating, and may protrude in a lateral direction from the side surfaces of the second semiconductor substrates 121.

In addition, as the first and second NCFs 135*as* and 135*p* are cured, their optical transmittance may be reduced. The first and second NCFs 135*as* and 135*p* may have the transmittance of about 60% or more in the visible light range before the curing, but the transmittance in the visible light range may be reduced to less than 10% by the curing.

In some embodiments, the curing operation may be omitted. In the attachment operation described with reference to FIGS. 5C and 5D, the first and second NCFs 135*as*, 135*p* may be cured, and in this case, a separate curing operation may be unnecessary.

Figure 5F:
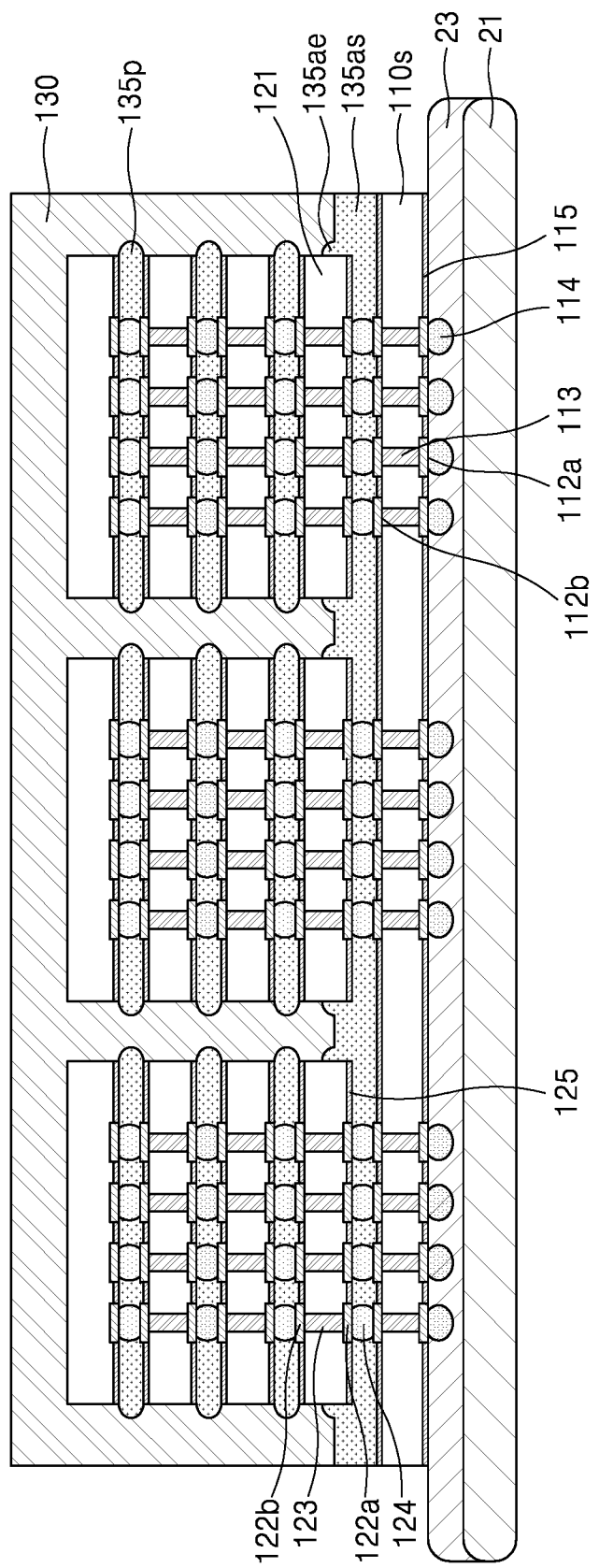

Referring to FIG. 5F, the molding layer 130 may be formed to surround the side surfaces and the upper surfaces of the plurality of second semiconductor substrates 121. In some embodiments, the molding layer 130 may surround only the side surfaces and expose the upper surfaces of the plurality of second semiconductor substrates 121. The molding layer 130 may be formed by using an epoxy molding compound material.

Figure 5G:
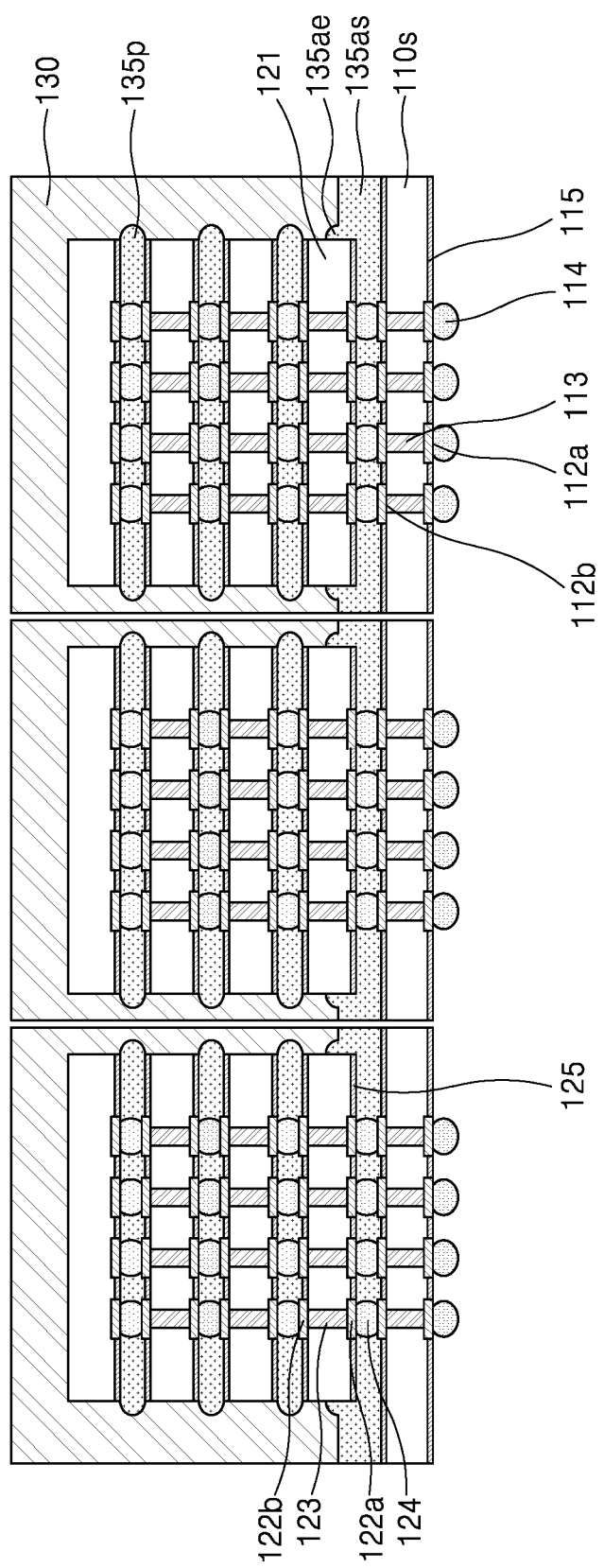

Referring to FIG. 5G, after the carrier substrate 21 is removed, respective semiconductor packages may be singulated.

Removal of the carrier substrate 21 may be performed by applying an external force to generate cracks in a surface of the binder 23. For example, the removal may be performed by applying an impact by using a blade or an initiator to generate cracks in the surface of the binder 23. Once a crack is generated, the crack may propagate and the carrier substrate 21 may be removed.

The singulation may be performed by using a saw, but is not limited thereto.

FIGS. 6A through 6F are schematic side cross-sectional views illustrating a manufacturing method of a semiconductor package, according to embodiments of the inventive concepts.

Figure 6A:
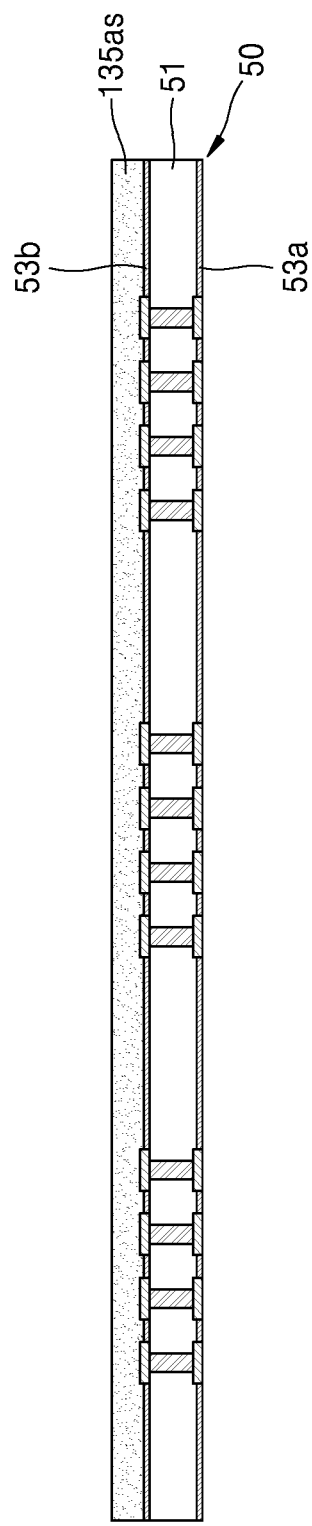
FIGS. 6A through 6F are schematic side cross-sectional views illustrating a manufacturing method of a semiconductor package, according to embodiments of the inventive concepts.

Referring to FIG. 6A, the first NCF 135*as* having substantially the same size (for example, a plan area) as a package substrate 50 may be provided on the package substrate 50. The first NCF 135*as* may be provided by applying the NCF 135 described with reference to FIG. 1, and may include the thermochromic pigment. Because the first NCF 135*as* has adhesion to a degree, the first NCF 135*as* may be attached on the package substrate 50. In addition, the first NCF 135*as* may not yet be cured sufficiently and/or completely, and thus may be somewhat in a changeable state by an external force.

For attachment of the first NCF 135*as*, the first NCF 135*as* may be heated at a temperature of about 170° C. to about 300° C. for about 1 second to about 20 seconds. A heating temperature and a heating time may be determined by considering an amount of thermal energy transferred to the first NCF 135*as*. When an excessive thermal energy is applied to the first NCF 135*as*, due to over-cure, it may be difficult to proceed with subsequent processes.

The package substrate 50 may include a base board layer 51, an upper insulating layer 53*b* and a lower insulating layer 53*a* respectively arranged on an upper surface and a lower surface of the base board layer 51, an upper pad 57*b* (see FIG. 6B) exposed by the upper insulating layer 53*b*, a lower pad 57*a* (see FIG. 6B) exposed by the lower insulating layer 53*a*. In some embodiments, the package substrate 50 may include a PCB. For example, the package substrate 50 may include a multi-layer PCB.

The base board layer 51 may include at least one material of phenol resin, epoxy resin, and/or polyimide. The base board layer 51 may include at least one of, for example, frame retardant 4 (FR4), tetrafunctional epoxy, polyphenylene ether, epoxy/polyphenylene oxide, bismaleimide triazine (BT), thermount, cyanate ester, polyimide, and liquid crystal polymer.

The upper insulating layer 53*b* may be provided on an upper surface of the base board layer 51. The upper insulating layer 53*b* may include, for example, a solder resist. In some embodiments, the upper insulating layer 53*b* may include epoxy resin.

The lower insulating layer 53*a* may be provided on a lower surface of the base board layer 51. The lower insulating layer 53*a* may include, for example, a solder resist. In some embodiments, the lower insulating layer 53*a* may include epoxy resin.

Figure 6B:
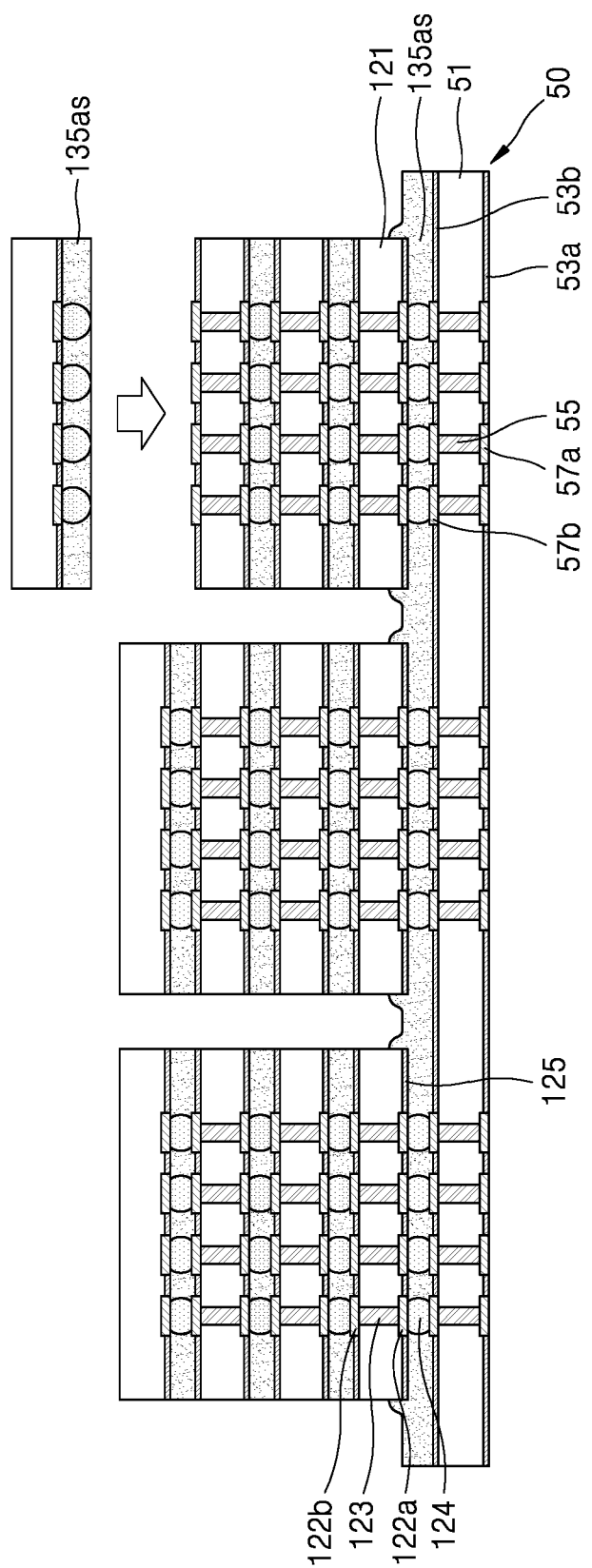

Referring to FIG. 6B, the plurality of second semiconductor substrates 121 may be stacked on the package substrate 50. As illustrated in FIG. 6B, the package substrate 50 may include an upper pad 57*b* exposed by the upper insulating layer 53*b* and a lower pad 57*a* exposed by the lower insulating layer 53*a*. External connection terminals may be connected to the lower pads 57*a* in a subsequent process. The inner connection terminal 124 electrically connecting the second semiconductor substrates 121 may be provided on the upper pads 57*b*. Each of the lower pads 57*a* and the upper pads 57*b* may include, for example, aluminum (Al), copper (Cu), nickel (Ni), cobalt (Co), zinc (Zn), silver (Ag), platinum (Pt), or an alloy thereof.

The second semiconductor substrates 121 may include the second semiconductor substrate 121 described with reference to FIGS. 3A through 5G. Thus, duplicate descriptions thereof are omitted.

The inner connection terminals 124 provided to the lowermost one of the second semiconductor substrates 121 may penetrate the first NCF 135*as* and contact the upper pads 57*b*. In this case, due to the volume of the inner connection terminal 124, a portion of the first NCF 135*as* may be protruded upward adjacent to the second semiconductor substrates 121.

The plurality of second semiconductor substrates 121 to which the first NCF 135*as* is added may be stacked on each of the second semiconductor substrates 121 arranged at the lowermost end. In some embodiments, a plan area of the first NCF 135*as* may be substantially the same as that of the second semiconductor substrate 121.

In some embodiments, for attachment of the first NCF 135*as*, the first NCF 135*as* may be heated at a temperature of about 170° C. to about 300° C. for about 1 second to about 20 seconds. A heating temperature and a heating time may be determined by considering an amount of thermal energy transferred to the first NCF 135*as*. When an excessive thermal energy is applied to the first NCF 135*as*, due to over-cure, it may be difficult to proceed with subsequent processes.

Figure 6C:
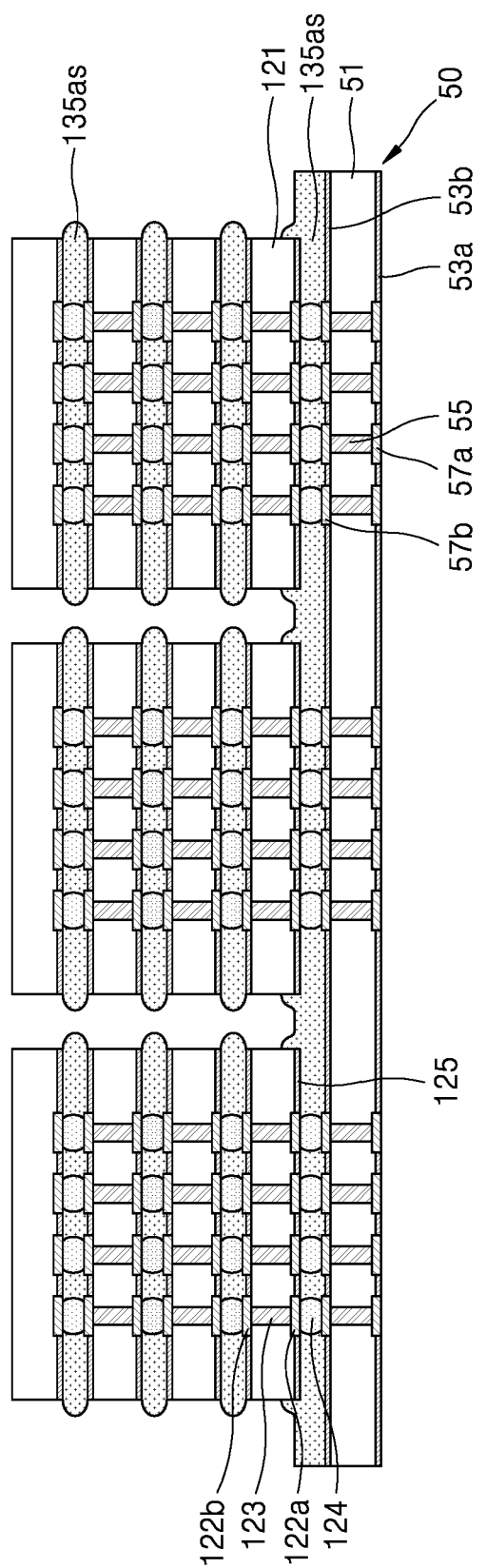

Referring to FIG. 6C, the first NCF 135*as* may be cured. The curing may be performed at a temperature of about 130° C. to about 210° C. for about 30 minutes to about 3 hours. The curing temperature may be somewhat lower than a temperature for attaching the first NCFs 135*as*. A duration time of the curing may be longer than a heating time for attaching the first NCFs 135*as*.

While the curing is performed by a cross-linking agent in the first NCFs 135*as*, the first NCFs 135*as* may be somewhat reflowed due to heating, and may protrude in a lateral direction from the side surfaces of the second semiconductor substrates 121.

In addition, as the first NCFs 135as are cured, their optical transmittance may be reduced. The first NCFs 135as may have the transmittance of about 60% or more in the visible light range before the curing, but the transmittance in the visible light range may be reduced to less than 10% by the curing.

In some embodiments, the curing operation may be omitted. In the attachment operation described with reference to FIG. 6B, the first NCFs 135as may be cured, and in this case, a separate curing operation may be unnecessary.

Figure 6D:
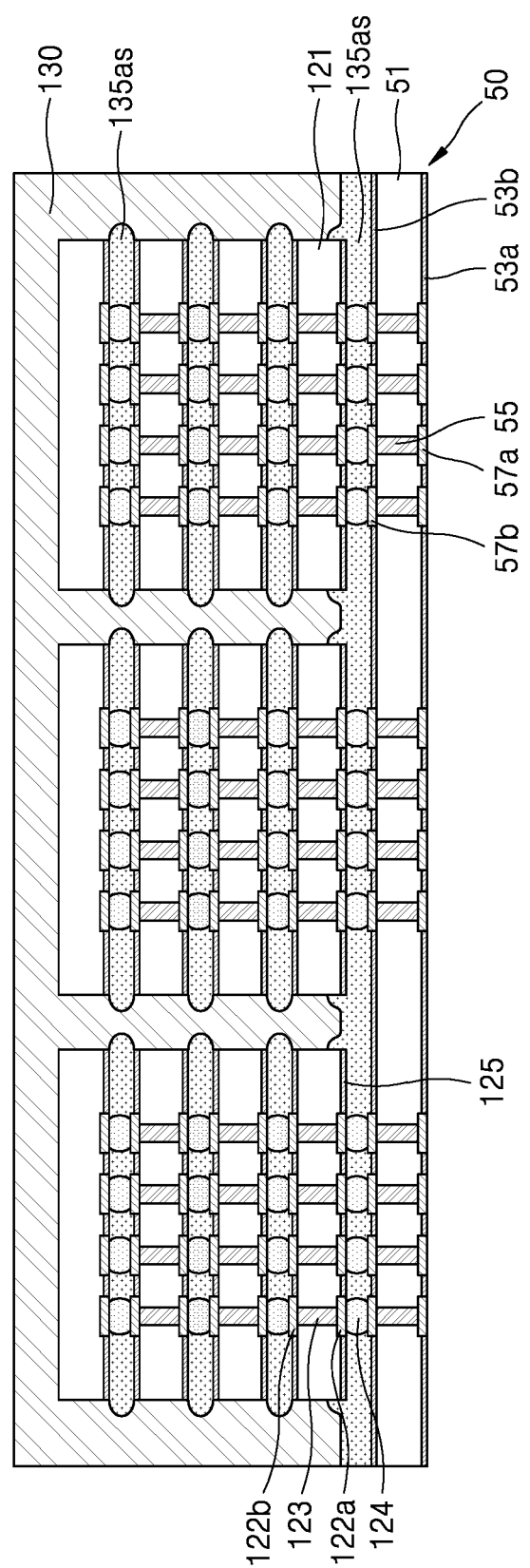

Referring to FIG. 6D, the molding layer 130 may be formed to surround the side surfaces and the upper surfaces of the plurality of second semiconductor substrates 121. In some embodiments, the molding layer 130 may surround only the side surfaces and expose the upper surfaces of the plurality of second semiconductor substrates 121. The molding layer 130 may be formed by using an epoxy molding compound material.

Figure 6E:
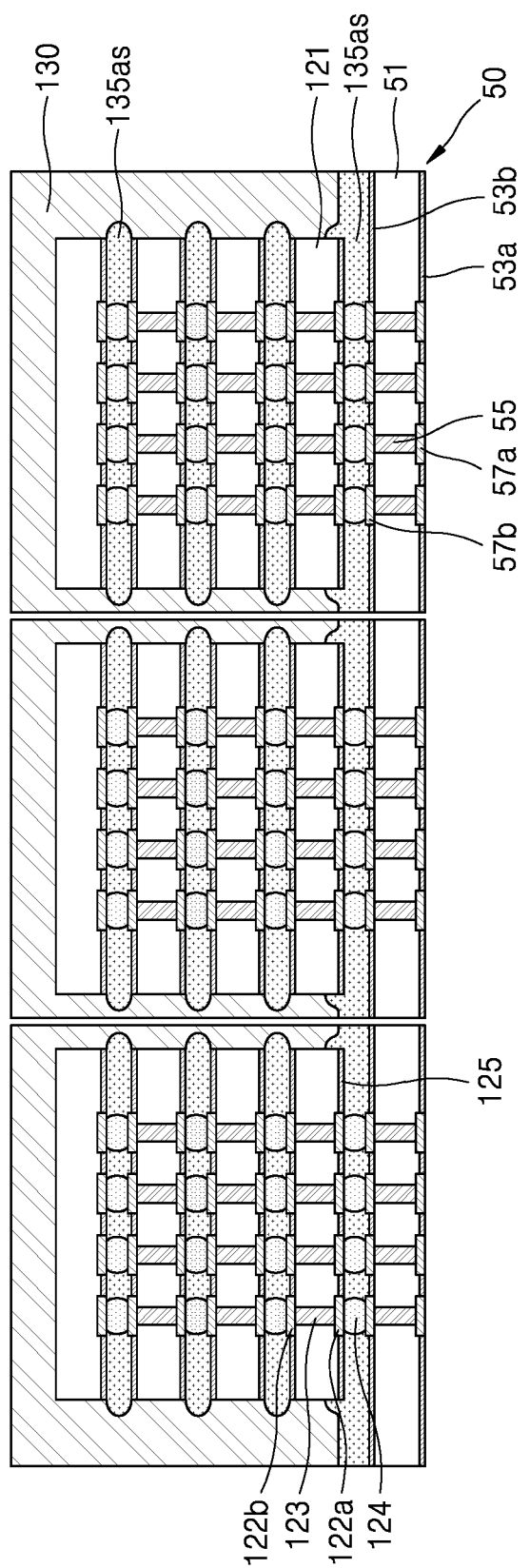

Referring to FIG. 6E, respective semiconductor packages may be singulated. The singulation may be performed by using a saw, but is not limited thereto.

Figure 6F:
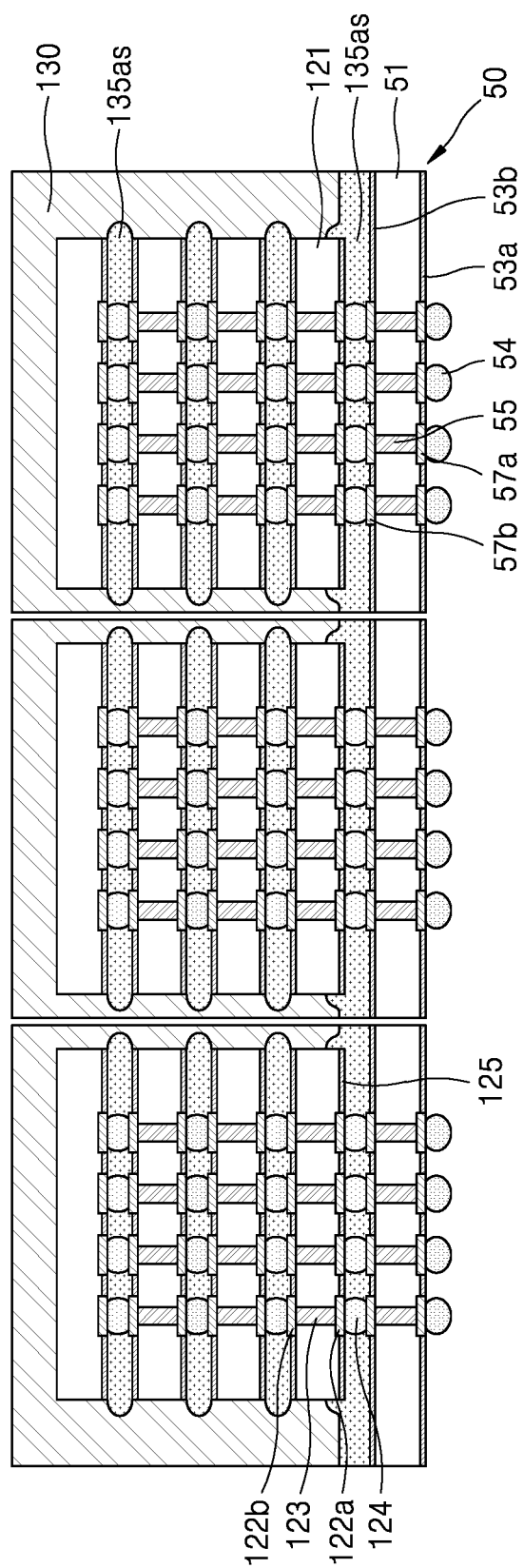

Referring to FIG. 6F, a package connection terminal 54 may be provided to the lower pad 57a. The package connection terminal 54 may connect a manufactured semiconductor package to an external device.

An NCF sheet of a stand-alone type and a semiconductor package including the NCF sheet may include a thermochromic pigment in which color is irreversibly changed due to heating, and thus, when a product failure occurs, the cause of failure may be easily identified. In addition, because color of the NCF changes identically or similarly to molding resin due to heating, even when the molding resin is exposed to the outside, misjudgment as a failure in an automated product inspection may be prevented and/or reduced, and thus product efficiency reduction may be prevented and/or reduced.

Figure 7:
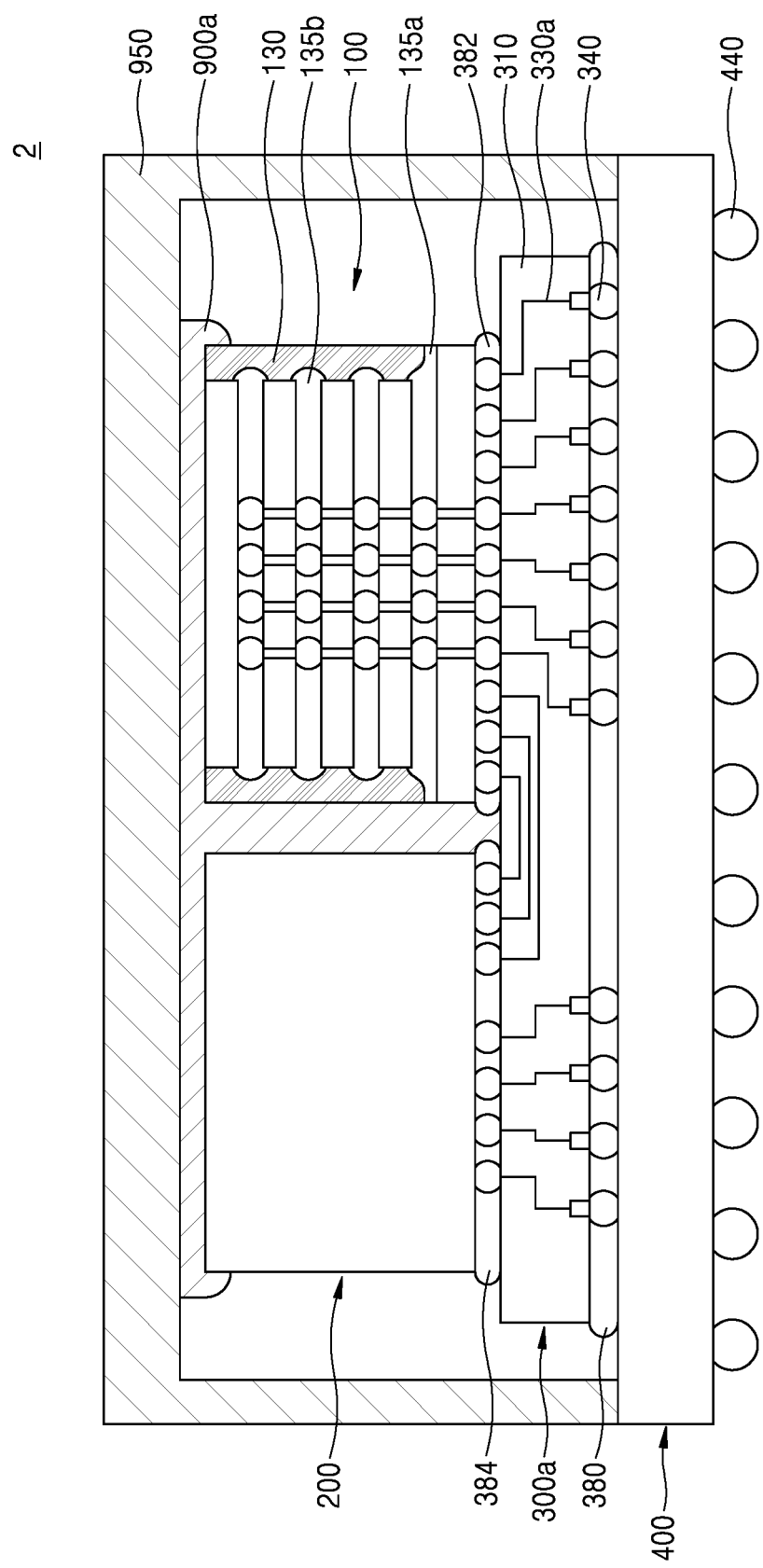
FIGS. 7 through 13 are cross-sectional views of a semiconductor package, according to embodiments of the inventive concepts.

FIG. 7 is a cross-sectional view of a semiconductor package 2, according to an embodiment of the inventive concepts. The semiconductor package 2 in FIG. 7 may be somewhat different in a configuration of a first substrate 300a and a TIM 900a with respect to the semiconductor package 1 illustrated in FIGS. 2 and 3A. Thus, descriptions below will be given based on this difference.

Referring to FIG. 7, connection wirings 330a may be provided instead of through electrodes inside the first substrate 300a. The first semiconductor device 100 and the second semiconductor device 200 may be connected to each other via the connection wiring 330a, and/or may be electrically connected to the second substrate 400 via the first substrate connection terminal 340. The connection wiring 330a may partially include a through silicon via (TSV).

In some embodiments, the second semiconductor device 200 may include a logic semiconductor device, and may include, for example, an application-specific integrated circuit (ASIC) such as a CPU, a GPU, and/or an SoC.

The TIM 900a may extend in a horizontal direction from an upper portion of the first semiconductor device 100 to an upper portion of the second semiconductor device 200. In addition, the TIM 900a may bury at least partially a space between the first semiconductor device 100 and the second semiconductor device 200.

The first semiconductor device 100 has been described with reference to FIG. 3A, and additional description thereof is omitted.

Figure 8:
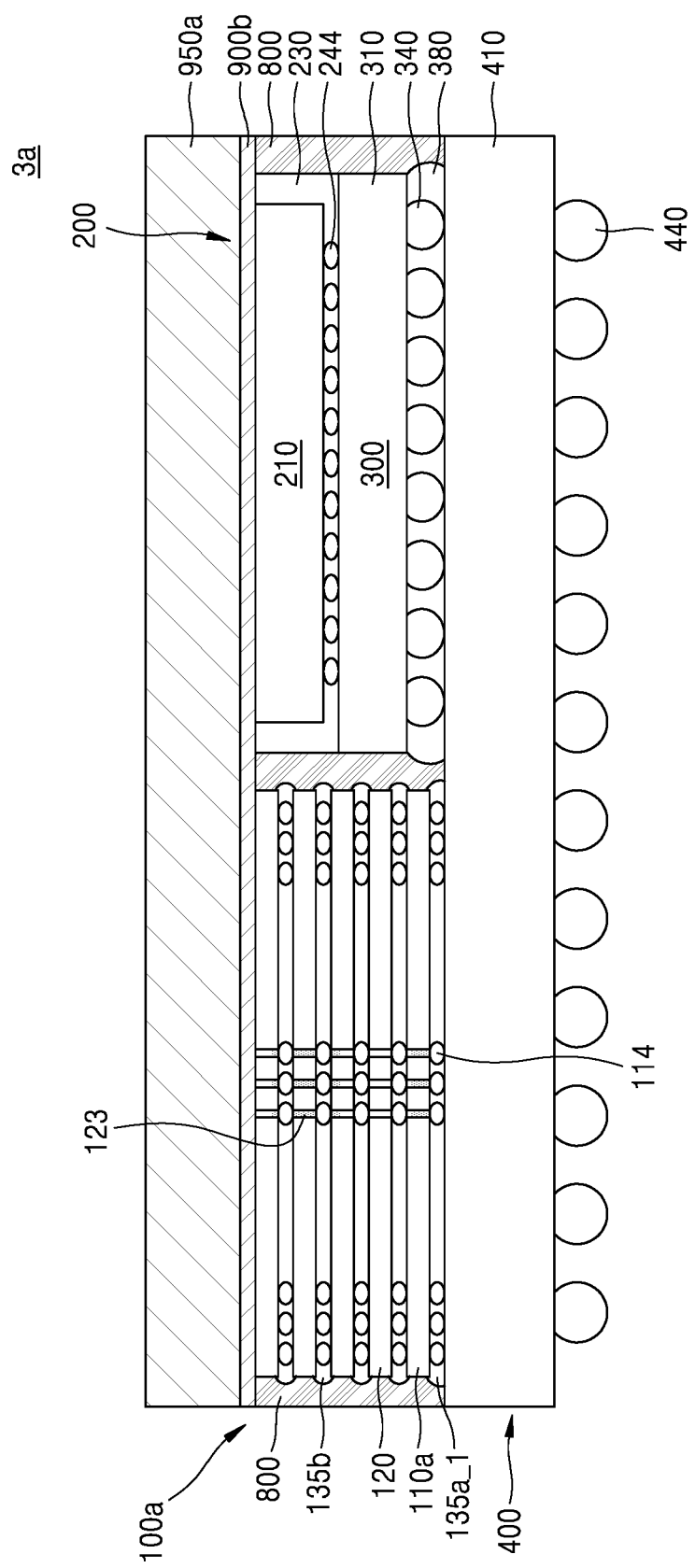

FIG. 8 is a cross-sectional view of a semiconductor package 3a, according to an embodiment of the inventive concepts.

Referring to FIG. 8, in the semiconductor package 3a, the second semiconductor device 200 may be mounted on the first substrate 300, and the first substrate 300 may be mounted on the second substrate 400. In addition, a first semiconductor device 100a may be mounted directly on the second substrate 400.

Side surfaces of the second semiconductor device 200 may be sealed by a molding layer 230. The molding layer 230 may include, for example, the EMC. In this case, an upper surface of the second semiconductor device 200 may be exposed from the molding layer 230. The molding layer 230 may fill a space between the second semiconductor device 200 and the first substrate 300.

In some embodiments, upper surfaces of the first semiconductor device 100a and the second semiconductor device 200 may directly contact a TIM 900b.

A heat dissipating member 950a may be provided on an upper portion of the TIM 900b. The heat dissipating member 950a may include, for example, a heat sink, a heat spreader, a heat pipe, or a liquid cooled cold plate.

A plurality of second semiconductor chips 120 may be attached to each other by the second NCF 135b. In addition, a first semiconductor chip 110a may be attached on the second substrate 400 by using a first NCF 135a_1. In some embodiments, the first NCF 135a_1 may be substantially the same as the second NCF 135b. In some other embodiments, the first NCF 135a_1 may be manufactured by using the NCF 135 described with reference to FIG. 1, and may include a thermochromic pigment.

In addition, the second semiconductor device 200 may be attached on the second substrate 400 by using the board underfill layer 380 to which the NCF 135 described with reference to FIG. 1 is applied.

The semiconductor package 3a may include the first substrate 300 on which the second semiconductor device 200 is mounted and the first semiconductor device 100a as being arranged adjacent to each other on the second substrate 400, and may be formed by attaching the TIM 900b and the heat dissipating member 950a on the first substrate 300 and the first semiconductor device 100a.

A through electrode 123 formed in the second semiconductor chips 120 at the uppermost end of stacked plurality of second semiconductor chips 120 of the first semiconductor device 100a may contact the TIM 900b. The TIM 900b may be electrically non-conductive. When the heat dissipating member 950a is electrically conductive, the through electrode 123 may be electrically insulated from the heat dissipating member 950a by the TIM 900b.

Figure 9:
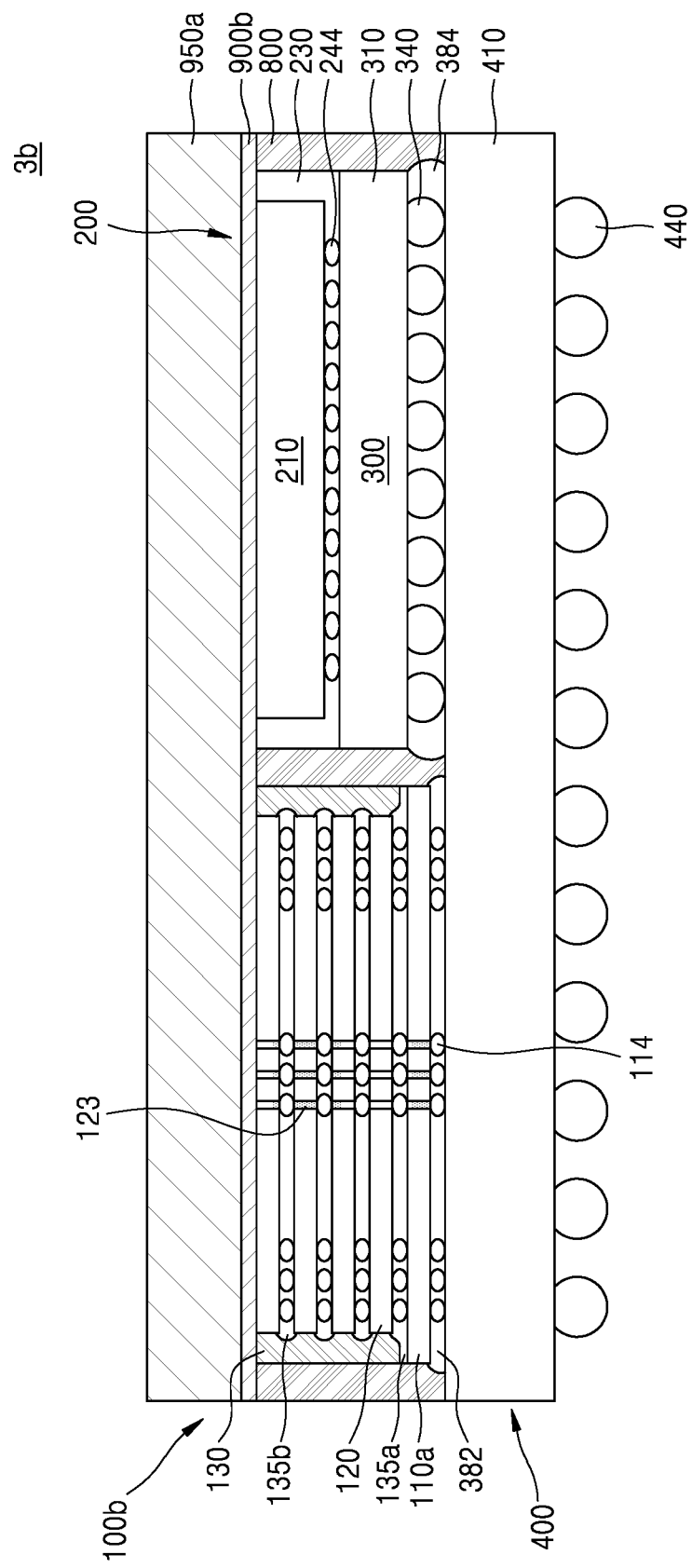

FIG. 9 is a cross-sectional view of a semiconductor package 3b, according to an embodiment of the inventive concepts.

Referring to FIG. 9, in the semiconductor package 3b, the second semiconductor device 200 may be mounted on the first substrate 300, and the first substrate 300 may be mounted on the second substrate 400. In addition, a first semiconductor device 100b may be mounted directly on the second substrate 400.

The first semiconductor device 100b may further include the molding layer 130. As described with reference to FIG. 3A, the molding layer 130 may be configured to surround the side surfaces of stacked plurality of second semiconductor chips 120, but not to cover the upper surface of the second semiconductor chip 120 at the uppermost end.

The first underfill layer 382 may be formed to fill a space between the first semiconductor device 100b and the second substrate 400. The first underfill layer 382 may include the NCF 135 described with reference to FIG. 1. In some embodiments, the first underfill layer 382 may be, for example, a portion of the package molding layer 800 formed in a molded underfill (MUF) method.

The second underfill layer 384 may be formed to fill a space between the second semiconductor device 200 and the second substrate 400. The second underfill layer 384 may include the NCF 135 described with reference to FIG. 1. In some embodiments, the second underfill layer 384 may be, for example, a portion of the package molding layer 800 formed in an MUF method.

The semiconductor package 3b may include the first substrate 300 in which the second semiconductor device 200 is mounted and the first semiconductor device 100b as being arranged adjacent to each other on the second substrate 400, and may be formed by attaching the TIM 900b and the heat dissipating member 950a on the first substrate 300 and the first semiconductor device 100a.

Figure 10:
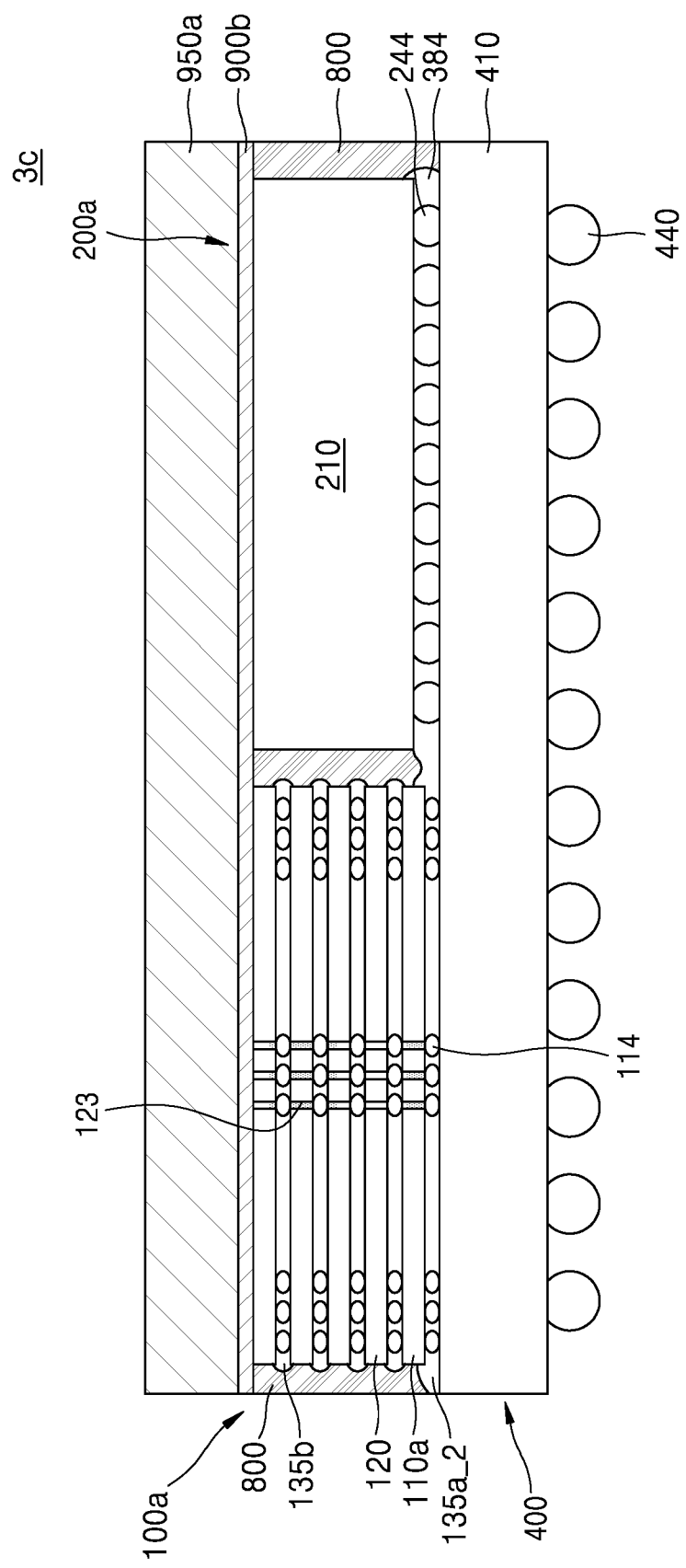

FIG. 10 is a cross-sectional view of a semiconductor package 3c, according to an embodiment of the inventive concepts.

Referring to FIG. 10, in the semiconductor package 3c, the first semiconductor device 100a and a second semiconductor device 200a may be mounted directly on the second substrate 400. The first semiconductor device 100a and the second semiconductor device 200a may be arranged adjacent to each other in the lateral direction.

The plurality of second semiconductor chips 120 may be attached to each other by the second non-conductive film 135b. In addition, the first semiconductor chip 110a may be attached on the second substrate 400 by using a first NCF 135a_2. In some embodiments, the first NCF 135a_2 may be substantially the same as the second non-conductive film 135b. In some other embodiments, the first NCF 135a_2 may be manufactured by using the NCF 135 described with reference to FIG. 1, and may include a thermochromic pigment.

The second semiconductor device 200a may be attached on the second substrate 400 so that an active surface thereof faces the second substrate 400. The second semiconductor device 200a may be electrically connected to the second substrate 400 via the second connection terminal 244 arranged on the active surface thereof. The second underfill layer 384 may be provided to fill a space between the second semiconductor device 200 and the second substrate 400. In some embodiments, the second semiconductor device 200a may include a wafer level package (WLP).

In some embodiments, the first NCF 135a_2 may be connected to the second underfill layer 384. There may be an interface between the first NCF 135a_2 and the second underfill layer 384.

Figure 11:
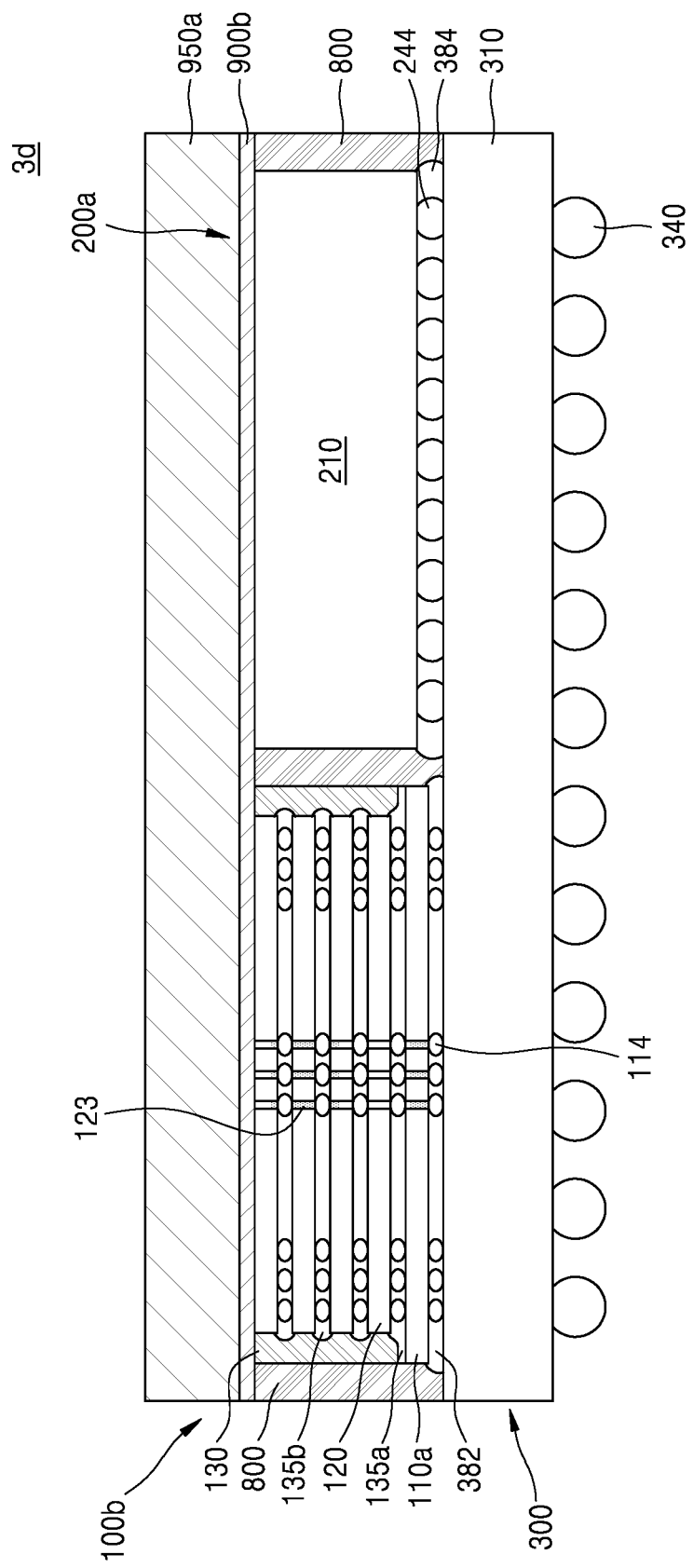

FIG. 11 is a cross-sectional view of a semiconductor package 3d, according to an embodiment of the inventive concepts.

Referring to FIG. 11, in the semiconductor package 3d, the first semiconductor device 100b and the second semiconductor device 200a may be mounted directly on the first substrate 300. The first semiconductor device 100b and the second semiconductor device 200a may be arranged adjacent to each other in the lateral direction.

The first semiconductor device 100b may further include the molding layer 130. As described with reference to FIG. 1B, the molding layer 130 may be configured to surround the side surfaces of stacked plurality of second semiconductor chips 120, but not to cover the upper surface of the second semiconductor chip 120 at the uppermost end. The first semiconductor device 100b has been described with reference to FIG. 3A, and detailed description thereof is omitted.

The second underfill layer 384 may be formed to fill a space between the second semiconductor device 200a and the first substrate 300. The second underfill layer 384 may include the NCF 135 described with reference to FIG. 1. In some embodiments, the second underfill layer 384 may be, for example, a portion of the package molding layer 800 formed in an MUF method.

In some embodiments, upper surfaces of the first semiconductor device 100b and the second semiconductor device 200a may directly contact a TIM 900b.

Figure 12:
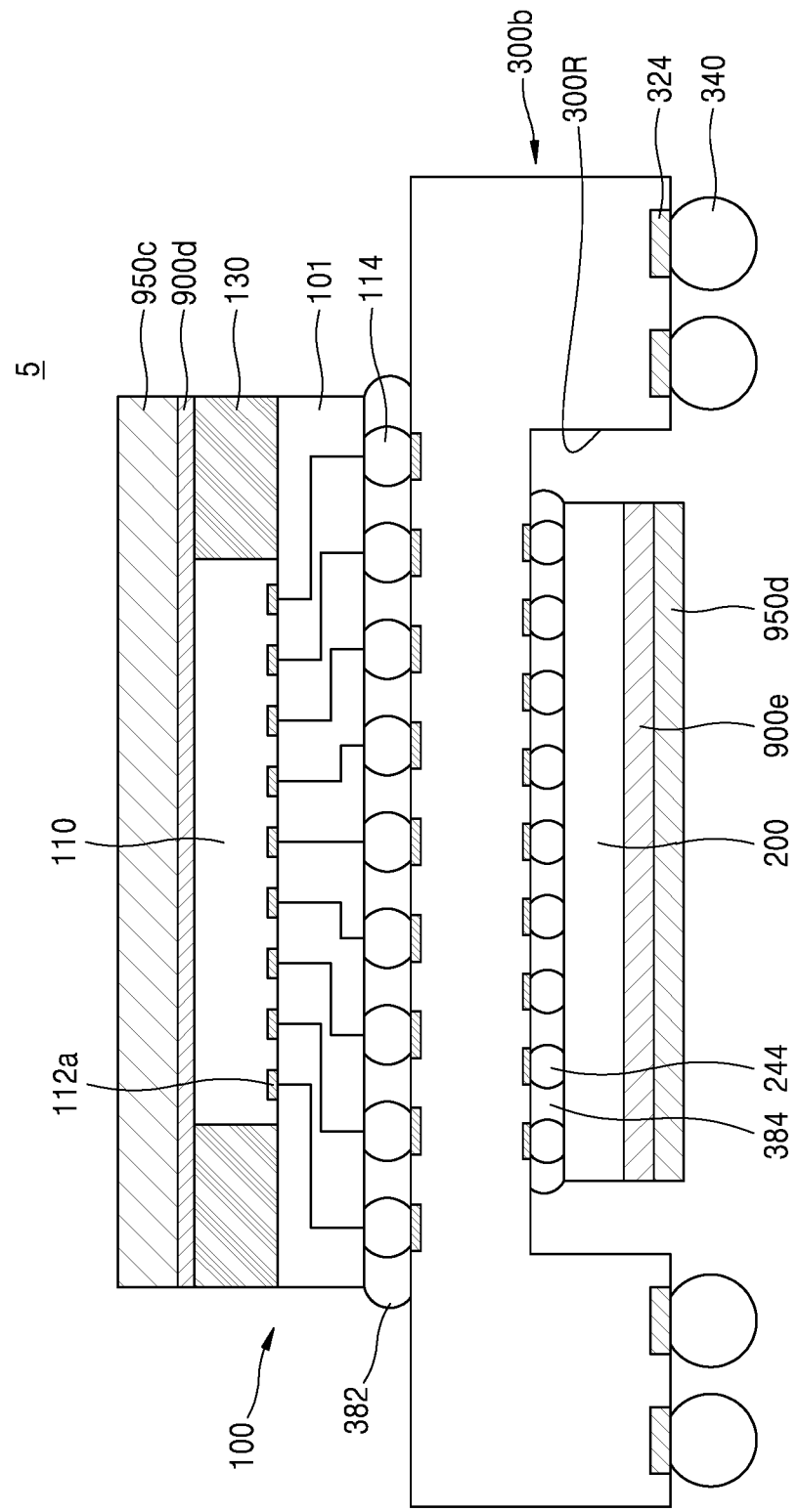

FIG. 12 is a side cross-sectional view of a semiconductor package 5, according to an embodiment of the inventive concepts.

Referring to FIG. 12, the first semiconductor device 100 and the second semiconductor device 200 may be mounted on two different surfaces of a first substrate 300b, respectively.

The first semiconductor device 100 may be provided on one side surface of the first substrate 300b. The first semiconductor device 100 may include the first semiconductor chip 110 and a fan-out layer 101 provided on the active surface of the first semiconductor chip 110. The fan-out layer 101 may include a fan-out redistribution layer or an interposer.

The first semiconductor device 100 may be electrically connected to the first substrate 300b via the first connection terminal 114. In addition, the first underfill layer 382 may fill a space between the first semiconductor device 100 and the first substrate 300b. The first underfill layer 382 may include the NCF 135 described with reference to FIG. 1.

The first semiconductor chip 110 may be sealed by the molding layer 130. The molding layer 130 may include, for example, the EMC. The upper surface of the first semiconductor device 100 may directly contact a first TIM 900d.

A first heat dissipating member 950c may be provided on the upper portion of the first TIM 900d. The first heat dissipating member 950c may include, for example, a heat sink, a heat spreader, a heat pipe, or a liquid cooled cold plate.

The first substrate 300b may include a recess portion 300R on the other side surface thereof. The second semiconductor device 200 may be provided in the recess portion 300R. The second semiconductor device 200 may be electrically connected to the first substrate 300b via the second connection terminal 244 arranged on the active surface of the second semiconductor device 200. In addition, the second underfill layer 384 may fill a space between the second semiconductor device 200 and the first substrate 300b. The second underfill layer 384 may include the NCF 135 described with reference to FIG. 1.

The lower surface of the second semiconductor device 200 may directly contact a second TIM 900e. In addition, a second heat dissipating member 950d may be provided on an upper surface of the second TIM 900e. In FIG. 12, the second TIM 900e is illustrated as in a flat shape, but the second TIM 900e may extend vertically to the side surface of the second semiconductor device 200. Furthermore, the second TIM 900e may be electrically connected to a ground terminal of the first substrate 300b.

Figure 13:
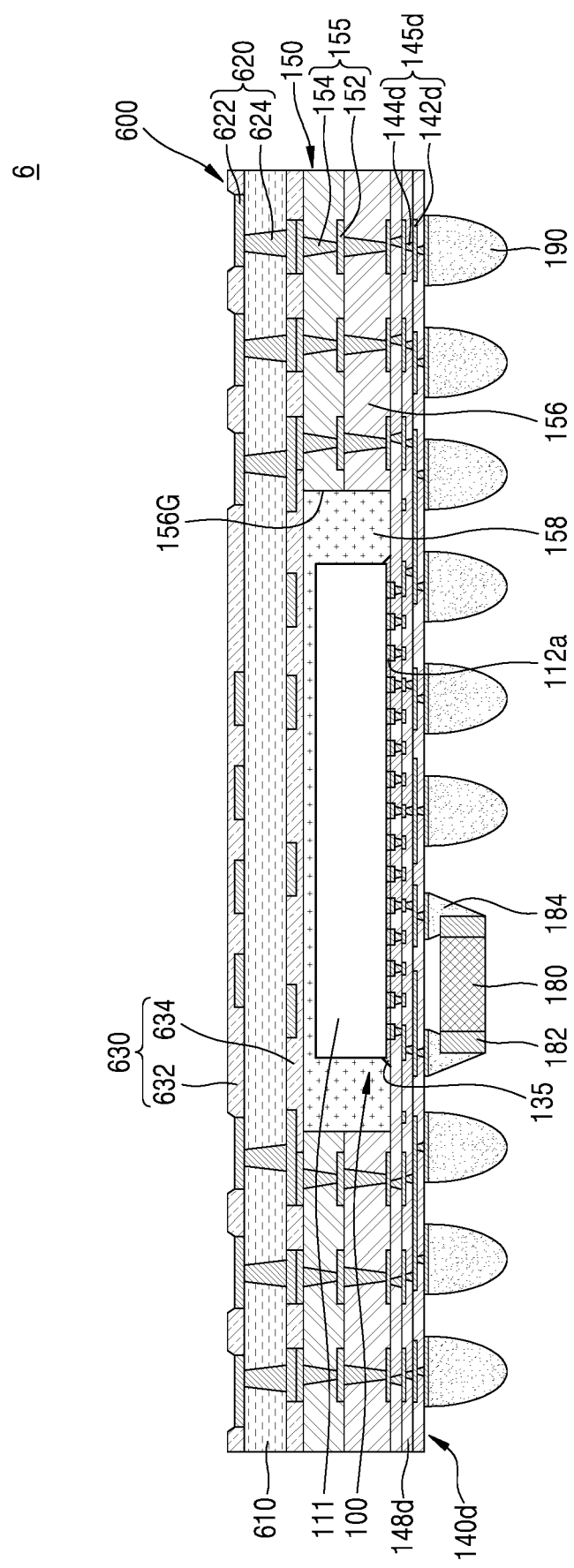

FIG. 13 is a side cross-sectional view of a semiconductor package 6, according to an embodiment of the inventive concepts.

Referring to FIG. 13, the semiconductor package 6 may include a redistribution layer 140d, an expansion layer 150 arranged on the redistribution layer 140d and having a mounting space 156G, at least one first semiconductor device 100 arranged in the mounting space 156G of the expansion layer 150, and a cover wiring layer 600 arranged on the expansion layer 150. The expansion layer 150 may surround the first semiconductor device 100.

The semiconductor package 6 may include a fan-out semiconductor package. In some embodiments, the expansion layer 150 may include a panel board, and the semiconductor package 6 may include a fan-out panel level package (FOPLP). For example, after the redistribution layer 140d is formed on the expansion layer 150, the semiconductor package 6 may be formed by attaching the cover wiring layer 600 on the expansion layer 150.

In some embodiments, a horizontal width and a horizontal area of the mounting space 156G may be greater than those of a footprint generated by the first semiconductor device 100. The side surface of the first semiconductor device 100 may be apart from an inside surface of the mounting space 156G.

The redistribution layer 140d and the cover wiring layer 600 may be referred to as a lower wiring structure and an upper wiring structure, respectively. In other words, the semiconductor package 6 may include the expansion layer 150 in which the first semiconductor device 100 is arranged, and the lower wiring structure and the upper wiring structure respectively covering a lower surface and an upper surface of the expansion layer 150.

The redistribution layer 140d may include a redistribution conductive structure 145d and a plurality of redistribution insulating layers 148d. The redistribution conductive structure 145d may include a plurality of redistribution line patterns 142d arranged on at least one surface of an upper surface and a lower surface of each of the plurality of redistribution insulating layers 148d, and a plurality of redistribution vias 144d penetrating at least one redistribution insulating layer 148d of the plurality of redistribution insulating layers 148d and being in contact with respectively some of the plurality of redistribution line patterns 142d. At least some of the plurality of redistribution line patterns 142d may be formed as one body with some of the plurality of redistribution vias 144d.

In some embodiments, the plurality of redistribution vias 144d may have a tapered shape in which a horizontal width is decreased from a lower side to an upper side and extends. In other words, the plurality of redistribution vias 144d may have a greater horizontal width away from the first semiconductor device 100.

The plurality of first upper surface connection pads 112a of the first semiconductor device 100 may be electrically connected to a redistribution conductive structure 145d. In some embodiments, some of a redistribution line pattern 142d arranged on a wiring layer at the uppermost end of a plurality of redistribution lines pattern 142d may contact the plurality of first upper surface connection pads 112a, but the inventive concepts are not limited thereto. In some embodiments, some of the redistribution vias 144d at the uppermost end of a plurality of redistribution vias 144d may contact the plurality of first upper surface connection pads 112a.

The first semiconductor device 100 may be attached to the redistribution layer 140d by using the NCF 135. Detailed description of the NCF 135 has been given with reference to FIG. 1, and additional descriptions thereof are omitted.

The cover wiring layer 600 may include, for example, a PCB, a ceramic substrate, a package manufacture wafer, or an interposer. In some embodiments, the cover wiring layer 600 may include a multi-layer PCB.

The cover wiring layer 600 may include at least one of a base insulating layer 610 and a wiring structure 620. The wiring structure 620 may include a plurality of wiring patterns 622 arranged on at least one surface of an upper surface and a lower surface of at least one base insulating layer 610, and a plurality of conductive vias 624 penetrating at least one base insulating layer 610 and being in contact with and connected to some of the plurality of wiring patterns 622. The wiring structure 620 may include copper, nickel, stainless steel, or beryllium copper.

The base insulating layer 610 may include at least one material of phenol resin, epoxy resin, and polyimide. The base insulating layer 610 may include at least one of, for example, flame retardant 4 (FR4), tetrafunctional epoxy, polyphenylene ether, epoxy/polyphenylene oxide, bismaleimide triazine (BT), thermount, cyanate ester, polyimide, and liquid crystal polymer.

On at least one of the upper surface and the lower surface of the base insulating layer 610, a solder resist layer 630 exposing some of the plurality of wiring patterns 622 may be formed. The solder resist layer 630 may include an upper surface solder resist layer 632 covering the upper surface of at least one base insulating layer 610 and exposing some of the plurality of wiring patterns 622, and a lower surface solder resist layer 634 covering the lower surface of at least one base insulating layer 610 and exposing some of the plurality of wiring patterns 622. In some embodiments, the upper surface solder resist layer 632 may be formed on the upper surface of at least one base insulating layer 610, while the lower surface solder resist layer 634 may not be formed on the lower surface at least one base insulating layer 610.

The expansion layer 150 may include, for example, a PCB, a ceramic substrate, a package manufacturing wafer, or an interposer. In some embodiment, the expansion layer 150 may include a multi-layer PCB. The mounting space 156G may be formed as an opening or a cavity in the expansion layer 150. The mounting space 156G may be formed in some region, for example, the center region of the expansion layer 150. The mounting space 156G may be recessed to a certain depth from an upper surface of the expansion layer 150, or may be open. To recess or open the expansion layer 150, dry etching, wet etching, screen print, drill bit, or a laser drilling process, or the like may be used.

The expansion layer 150 may include a connection structure 155 and at least one substrate base 156. The connection structure 155 may include a connection wiring pattern 152 and a connection conductive via 154. The connection wiring pattern 152 and the connection conductive via 154 of the expansion layer 150, and the substrate base 156 may include substantially similar materials to, and may be formed similarly to, the wiring pattern 622 and the conductive via 624 of the cover wiring layer 600, and the base insulating layer 610, respectively, and thus, detailed descriptions thereof are omitted.

The semiconductor package 6 may further include a filling insulating layer 158 filling a space between the first semiconductor device 100 and the expansion layer 150. For example, the filling insulating layer 158 may be formed of thermosetting resin such as epoxy resin, thermoplastic resin such as polyimide, or resin including an adder such as an inorganic filler added thereto, for example, Ajinomoto build-up film (ABF), FR-4, BT, etc. In some embodiments, the filling insulating layer 158 may be formed of a molding material such as EMC or a photosensitive material.

In some embodiments, the filling insulating layer 158 may be formed, after silicon oxide is deposited at a certain thickness, by filling a portion of the mounting space 156G, that has not been filled by silicon oxide, by using polymer such as polyimide.

In some embodiments, the filling insulating layer 158 may be formed, after a polymer such as polyimide is formed so that the inactive surface of the first semiconductor device 100 is exposed to the outside, by covering the inactive surface of the first semiconductor device 100 by an insulating material. The insulating material may include, for example, a silicon oxide layer, a silicon nitride layer, and/or a silicon oxynitride layer.

On the expansion layer 150, the cover wiring layer 600 including the wiring structure 620 electrically connected to the connection structure 155 may be arranged.

After the redistribution layer 140*d* is formed on the expansion layer 150, the semiconductor package 6 may be formed by attaching the cover wiring layer 600 on the expansion layer 150.

Because the redistribution layer 140*d* is formed on the expansion layer 150, the plurality of redistribution vias 144*d* may have a tapered shape in which a horizontal width of each of the plurality of redistribution vias 144*d* is decreased from a lower side to an upper side and extends. In other words, each of the plurality of redistribution vias 144*d* may have a greater horizontal width away from the first semiconductor device 100.

Figure 14A:
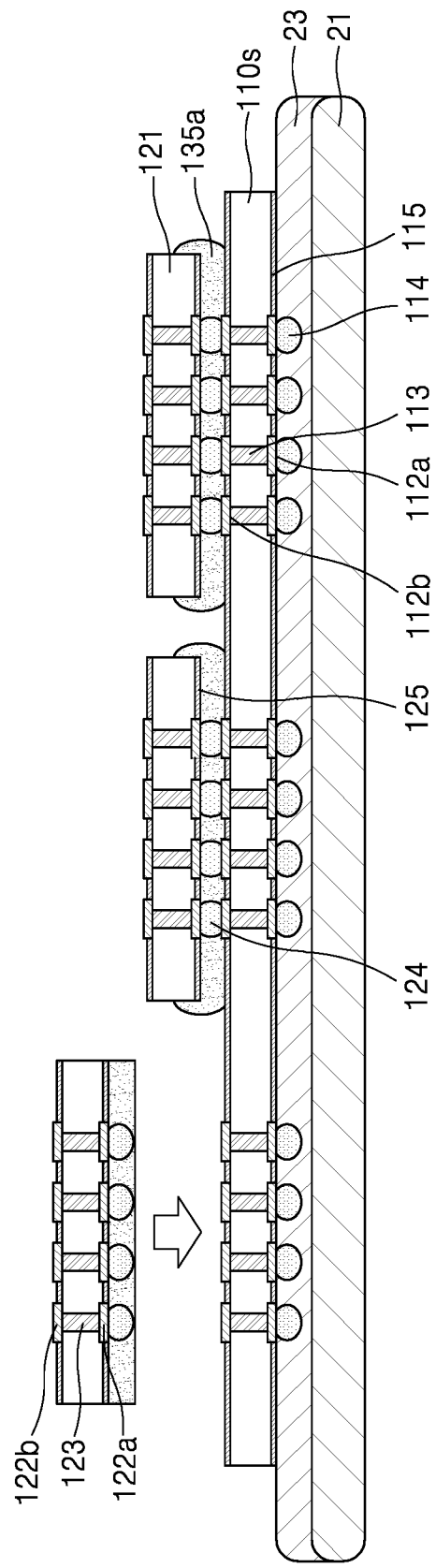
FIGS. 14A through 14C are schematic side cross-sectional views illustrating a manufacturing method of a semiconductor package, according to embodiments of the inventive concepts.
Figure 14B:
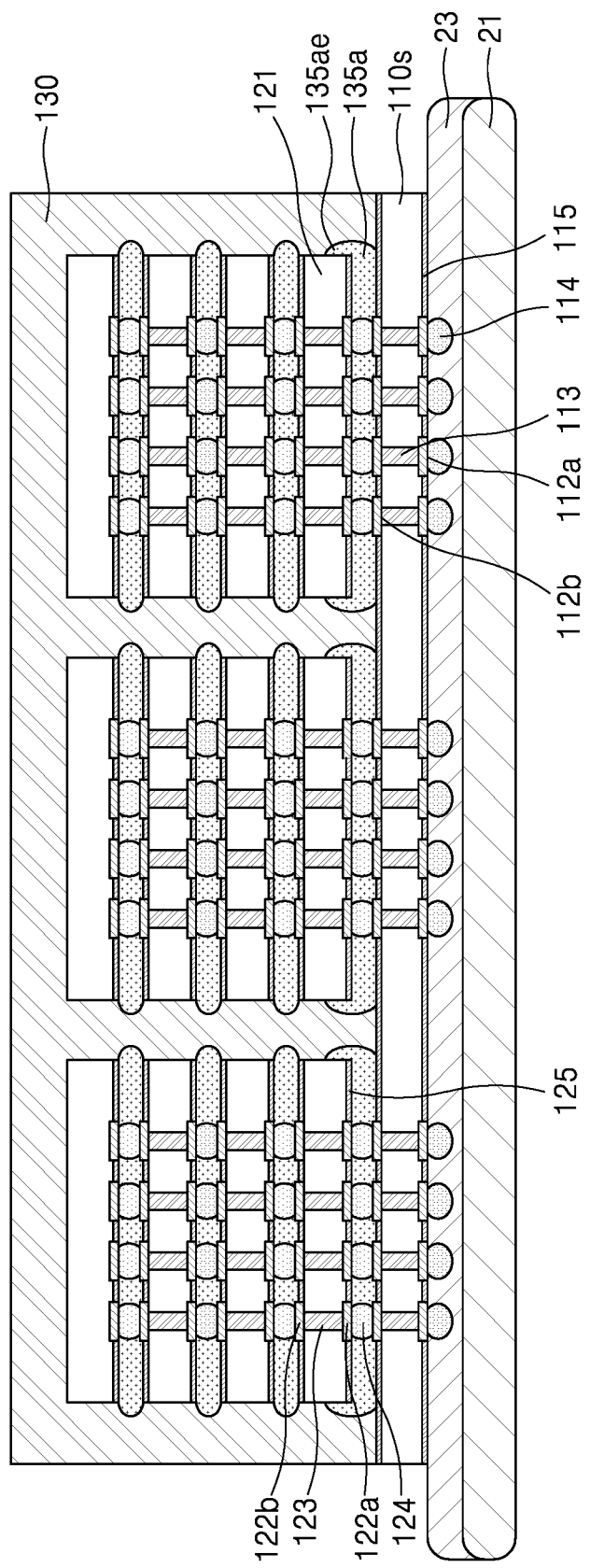
Figure 14C:
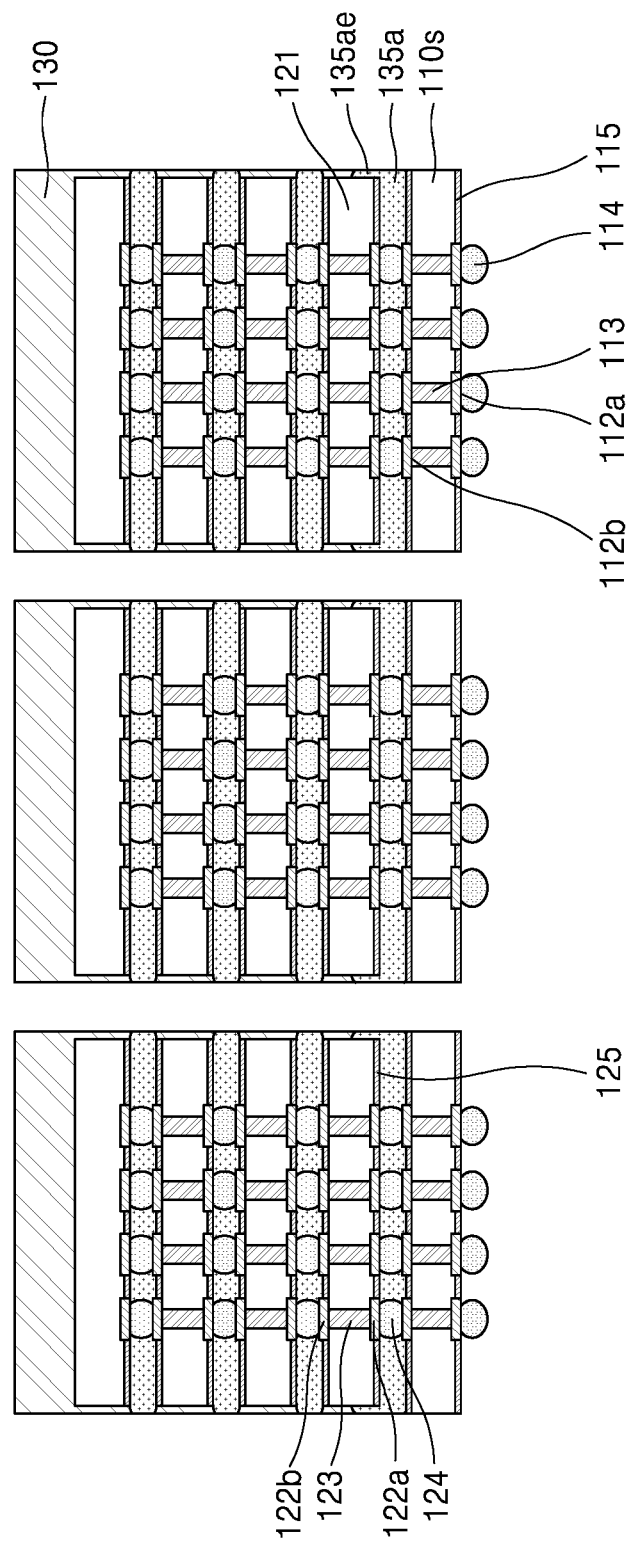

FIGS. 14A through 14C are schematic side cross-sectional views illustrating a manufacturing method of a semiconductor package, according to embodiments. The manufacturing method of a semiconductor package illustrated in FIGS. 14A through 14C may illustrate the manufacturing method of the semiconductor package 1 illustrated in FIGS. 4A and 4B.

Operations of FIG. 14A may include operations following the operations of FIG. 5A. Referring to FIG. 14A, the plurality of second semiconductor substrates 121 may be stacked on the semiconductor substrate 110*s*.

Each of the plurality of second semiconductor substrates 121 may include the first NCF 135*a* attached thereto, and may attach the first NCF 135*a* to the semiconductor substrate 110*s*. The first NCF 135*a* may be transparent or translucent, and thus may be easily arranged at a corresponding location of the semiconductor substrate 110*s*. In addition, the first NCF 135*a* may have substantially the same size (for example, a plan area) as the second semiconductor substrate 121.

In FIG. 14A, it is illustrated that the protrusions are formed in the first NCF 135*a* attached to the semiconductor substrate 110*s*, but depending on the case, the protrusions have not been generated yet.

Referring to FIG. 14B, an additional second semiconductor substrate 121 may be further stacked on the second semiconductor substrate 121. After the first NCF 135*a* is cured, the molding layer 130 may be formed.

An attachment condition and a curing condition of the first NCF 135*a* has been described with reference to FIGS. 5A through 5G, and thus duplicate descriptions are omitted.

In some embodiments, the first NCF 135*a* located between the semiconductor substrate 110*s* and the second semiconductor substrate 121 located at the lowermost end may be partially reflowed during the attachment and curing processes, and may have a shape convex outward.

Referring to FIG. 14C, the carrier substrate 21 may be removed and a singulation operation may be performed. In this case, a convex portion of the first NCF 135*a* located between the semiconductor substrate 110*s* and the lowermost ones of the second semiconductor substrates 121 may be exposed to the outside of the molding layer 130 due to sawing. In addition, because the molding layer 130 fills a space between the convex portion and the semiconductor substrate 110*s* prior to the sawing, due to the sawing, a portion of the molding layer 130 filling the space may be limited to an upper portion of the semiconductor substrate 110*s* under the convex portion. In this manner, the molding layer remainder 130*d* as illustrated in FIG. 4 may be formed.

While the inventive concepts have been particularly shown and described with reference to embodiments thereof, it will be understood that various changes in form and details may be made therein without departing from the scope of the following claims.

What is claimed is:

1. A non-conductive film (NCF) sheet comprising:
 an NCF comprising an irreversible thermochromic pigment, the NCF comprising first and second opposing surfaces;
 a first cover film on the first surface of the NCF; and
 a second cover film on the second surface of the NCF,
 wherein a content of the irreversible thermochromic pigment in the NCF is about 0.1 wt % to about 5 wt % with respect to a weight of the NCF.

2. The NCF sheet of claim 1, wherein an average particle diameter of the irreversible thermochromic pigment in the NCF is about 0.5 µm to about 50 µm.

3. The NCF sheet of claim 1, wherein a color of the irreversible thermochromic pigment changes to black as temperature is increased.

4. The NCF sheet of claim 1, wherein the NCF comprises a matrix polymer and a cross-linking agent in the matrix polymer,
 wherein the irreversible thermochromic pigment comprises a leuco dye or an organic metal compound comprising a metal and an organic ligand coordinated with the metal, and
 wherein the metal is selected from a group consisting of copper (Cu), manganese (Mn), chrome (Cr), cobalt (Co), nickel (Ni), iron (Fe), and vanadium (V).

5. The NCF sheet of claim 1, wherein a transmittance of the NCF is greater than about 60% for light having a wavelength range of about 380 nm to about 750 nm.

6. A semiconductor package comprising:
 at least one semiconductor device on a first substrate;
 a non-conductive film (NCF) on the at least one semiconductor device and comprising an irreversible thermochromic pigment; and
 a molding member on the at least one semiconductor device in a lateral direction,
 wherein a content of the irreversible thermochromic pigment in the NCF is about 0.1 wt % to about 5 wt % with respect to a weight of the NCF.

7. The semiconductor package of claim 6, wherein the NCF is between the first substrate and the at least one semiconductor device.

8. The semiconductor package of claim 7, wherein the NCF extends to a side surface of the molding member.

9. The semiconductor package of claim 7, wherein the NCF comprises a ridge portion adjacent to the at least one semiconductor device and protruding in a direction away from the first substrate.

10. The semiconductor package of claim 9, wherein the NCF further comprises a flat portion that overlaps the first substrate but does not overlap the at least one semiconductor device, and
 wherein an upper surface of the NCF extends substantially in parallel with a surface of the first substrate in the flat portion.

11. The semiconductor package of claim 7, wherein the NCF extends to a side surface of the molding member, and wherein a portion of the molding member is between the first substrate and the NCF on the side surface to which the NCF extends.

12. The semiconductor package of claim 6, wherein the at least one semiconductor device comprises two or more semiconductor devices, and
wherein the NCF is between the two or more semiconductor devices.

13. A semiconductor package comprising:
a package substrate;
an interposer substrate on the package substrate;
a first semiconductor device on the interposer substrate and comprising stacked semiconductor chips; and
a second semiconductor device adjacent to the first semiconductor device and on the interposer substrate,
wherein the first semiconductor device comprises a non-conductive film (NCF) comprising an irreversible thermochromic pigment.

14. The semiconductor package of claim 13, wherein the NCF is a first NCF, and
wherein the semiconductor package further comprises a second NCF comprising an irreversible thermochromic pigment between the first semiconductor device and the interposer substrate.

15. The semiconductor package of claim 13, wherein the NCF is a first NCF, and
wherein the semiconductor package further comprises a second NCF comprising an irreversible thermochromic pigment between the second semiconductor device and the interposer substrate.

16. The semiconductor package of claim 13, wherein irreversible thermochromic pigment of the NCF is configured to change color at a temperature from 60° C. to 400° C.

17. The semiconductor package of claim 13, wherein the first semiconductor device comprises a first semiconductor chip and a plurality of second semiconductor chips stacked on the first semiconductor chip, and
wherein the NCF is between the first semiconductor chip and the plurality of second semiconductor chips.

18. The semiconductor package of claim 17, wherein the first semiconductor device further comprises a molding member on the plurality of second semiconductor chips in a lateral direction,
wherein the NCF extends to a side surface of the molding member, and
wherein a transmittance of the NCF is less than about 10% for light having a wavelength range of 380 nm to 750 nm.

19. The semiconductor package of claim 18, wherein the first semiconductor device is connected to the interposer substrate via a plurality of first connection terminals,
wherein the second semiconductor device is connected to the interposer substrate via a plurality of second connection terminals,
wherein a package connection terminal for a connection to an external device is under the package substrate, and
wherein diameters of the plurality of first connection terminals and the plurality of second connection terminals are less than a diameter of the package connection terminal.

* * * * *